(12) United States Patent
Kataoka et al.

(10) Patent No.: US 8,995,132 B2
(45) Date of Patent: Mar. 31, 2015

(54) STRUCTURE FOR MOUNTING HEAT SINK, AND HEAT SINK MOUNTED USING THE STRUCTURE

(76) Inventors: Tetsuji Kataoka, Shizuoka (JP); Taijirou Kataoka, Shizuoka (JP)

( * ) Notice: Subject to any disclaimer, the term of this patent is extended or adjusted under 35 U.S.C. 154(b) by 200 days.

(21) Appl. No.: 13/704,695

(22) PCT Filed: May 11, 2011

(86) PCT No.: PCT/JP2011/063387
§ 371 (c)(1),
(2), (4) Date: Dec. 17, 2012

(87) PCT Pub. No.: WO2011/158756
PCT Pub. Date: Dec. 22, 2011

(65) Prior Publication Data
US 2013/0094149 A1  Apr. 18, 2013

(30) Foreign Application Priority Data

Jun. 18, 2010  (JP) ................................. 2010-139139

(51) Int. Cl.
*H05K 7/20* (2006.01)
*H01L 23/40* (2006.01)
*G06F 1/20* (2006.01)

(52) U.S. Cl.
CPC ........ *H01L 23/4093* (2013.01); *H01L 23/4006* (2013.01); *H01L 2924/0002* (2013.01)
USPC ...... 361/709; 361/679.54; 361/704; 361/710; 361/719; 165/80.2; 165/80.3; 165/104.33; 165/185; 24/296; 24/458

(58) Field of Classification Search
USPC ............... 361/679.46, 679.54, 704–712, 715, 361/719–727; 165/80.2, 80.3, 80.4, 80.5, 165/104.33, 104.34, 185; 257/706–727; 174/15.1, 16.3, 252, 260; 29/890.03, 29/832, 592.1; 24/453, 457, 458, 625, 24/588, 589, 981, 459; 248/316.7, 505, 248/506, 510, 71; 411/511, 516, 520, 522, 411/530
See application file for complete search history.

(56) References Cited

U.S. PATENT DOCUMENTS 5,640,305 A * 6/1997 Smithers ........................ 361/719
5,734,556 A * 3/1998 Saneinejad et al. ........... 361/719
(Continued)

FOREIGN PATENT DOCUMENTS

JP  5-259670 A   10/1993
JP  2005-150192  6/2005

OTHER PUBLICATIONS

International Search Report mailed Jul. 5, 2011 for International Application No. PCT/JP2011/063387.

*Primary Examiner* — Michail V Datskovskiy
(74) *Attorney, Agent, or Firm* — Antonelli, Terry, Stout & Kraus, LLP.

(57) ABSTRACT

A new mounting structure is provided in which, when a heat sink is mounted (fixed) on a circuit board using a spring member, an anchor for fixing the spring member is formed in a very small size in plan view. In the present invention, at least one anchor for mounting a heat sink body on a circuit board is set in a projected state on the heat sink body side and both ends of a spring member are each directly or indirectly attached to an anchor, whereby the heat sink body is mounted on the circuit board. In the anchor, a main body section projecting on the circuit board is formed in a substantially circular shape or a polygonal shape. When the spring member is attached to the anchor, the spring member is attached to an attaching section in an externally fit state.

9 Claims, 15 Drawing Sheets

(56) References Cited

U.S. PATENT DOCUMENTS

| | | | |
|---|---|---|---|
| 6,105,215 A * | 8/2000 | Lee | 24/458 |
| 6,141,220 A * | 10/2000 | Lin | 361/704 |
| 6,250,375 B1 | 6/2001 | Lee et al. | |
| 6,353,537 B2 * | 3/2002 | Egawa | 361/704 |
| 6,492,202 B1 * | 12/2002 | Lober et al. | 438/122 |
| 6,563,716 B1 * | 5/2003 | Truong et al. | 361/816 |
| 6,646,881 B1 * | 11/2003 | Lai et al. | 361/719 |
| 6,683,449 B1 * | 1/2004 | Bell et al. | 324/71.1 |
| 6,724,632 B2 * | 4/2004 | Lee et al. | 361/719 |
| 6,731,506 B1 * | 5/2004 | Dong et al. | 361/719 |
| 6,734,371 B2 * | 5/2004 | Arrigotti et al. | 174/260 |
| 6,948,554 B2 * | 9/2005 | Lee et al. | 165/80.3 |
| 7,167,369 B1 * | 1/2007 | Huynh et al. | 361/719 |
| 7,183,496 B2 * | 2/2007 | Arrigotti et al. | 174/260 |
| 7,203,066 B2 * | 4/2007 | Lee et al. | 361/704 |
| 7,321,493 B2 * | 1/2008 | Liang et al. | 361/719 |
| 7,382,622 B2 * | 6/2008 | Li et al. | 361/719 |
| 7,417,860 B2 * | 8/2008 | Yang et al. | 361/710 |
| 7,460,372 B2 * | 12/2008 | Liao et al. | 361/704 |
| 7,558,066 B2 * | 7/2009 | Eckberg et al. | 361/704 |
| 7,643,299 B2 * | 1/2010 | Lai et al. | 361/710 |
| 7,672,136 B2 * | 3/2010 | He et al. | 361/719 |
| 7,746,645 B2 * | 6/2010 | He et al. | 361/709 |
| 7,885,077 B2 * | 2/2011 | Sass et al. | 361/710 |
| 8,139,361 B1 * | 3/2012 | Hager et al. | 361/719 |
| 8,201,617 B2 * | 6/2012 | Ye et al. | 165/80.3 |
| 2009/0154109 A1 * | 6/2009 | Chen et al. | 361/709 |

* cited by examiner (a)

(b)

STRUCTURE FOR MOUNTING HEAT SINK, AND HEAT SINK MOUNTED USING THE STRUCTURE

RELATED APPLICATIONS

The application is a U.S. national phase under 35 U.S.C. §371 of International Application No. PCT/JP2011/063387 filed Jun. 10, 2011, claiming priority of Japanese Application No. 2010-139139 filed Jun. 18, 2010.

TECHNICAL FIELD

The present invention relates to a heat sink for efficiently discharging heat emitted from an electronic component (a semiconductor circuit element) of a microprocessor, an inverter, or the like and, more particularly, to a new mounting structure in which, when the heat sink is mounted on a circuit board using a spring member, an anchor for fixing (hooking) the spring member is formed in a very small size in plan view and a setting area of the anchor is minimized to enable a circuit board area to be extremely effectively utilized.

BACKGROUND ART

A semiconductor circuit element mounted (loaded) on a circuit board generates heat according to the operation of an electronic device. Therefore, in order to efficiently discharge the heat, a heat sink (a heat exchange component) is mounted (fixed) to the circuit board to be compression-bonded (closely attached) to the semiconductor circuit element. According to the improvement of performance of the semiconductor circuit element, the circuit board is further increased in density. Concerning the heat sink, there is increasing necessity to enable a high-performance heat sink to be quickly and accurately fixed in a small attaching area.

Incidentally, when a heat sink 1' is mounted (fixed) on a circuit board B, for example, as shown in FIG. 17, mounting means employing a wire spring 41' having a substantially Z shape in plan view is known (see, for example, Patent Literature 1).

In this method, components (anchors 5') having a substantially U shape for hooking both ends of the wire spring 41' are set on the circuit board B in advance. To press the heat sink 1' with the wire spring 41', both end portions of the wire spring 41' are hooked to (fit in) U-shape portions of the anchors 5' while being bent. The heat sink 1' is pressed and fixed to the circuit board B side.

As the anchors 5', there are the anchors 5' fit in and set from the opposite side of a mounting surface of the heat sink 1' (the substrate rear surface) as shown in an enlarged view of FIG. 17(a) and the anchors 5' set on the mounting surface side of the heat sink 1' (the upper surface of the circuit board B) as shown in FIG. 17(b). In the case of FIG. 17(a) in which the anchors 5' are set from the substrate rear surface, brim-like flanges 53' are formed to prevent the anchors 5' from slipping off the circuit board B with a tensile force of the wire spring 41'. On the other hand, in the case of FIG. 17(b) in which the anchors 5' are set from the substrate upper surface, portions projecting to the substrate rear surface need to be fixed by solder or the like.

The anchors 5' having the substantially U shape have a problem explained below. In FIG. 17(a), elongated holes (slit-like openings) have to be formed on the circuit board B in order to fit the anchors 5' therein. In FIG. 17(b), elongated ranges on the substrate have to be secured as areas for attachment in order to attach the anchors 5' (slit-like areas). Therefore, in both cases, as a result, a relatively large range including the elongated areas on the circuit board B cannot be used for a circuit.

Various members other than the heat sink 1' (the semiconductor circuit element) are mounted on the circuit board B. Further, in general, the anchors 5' are arranged in two places on the outer side of the heat sink 1' (further on the outer side than a range in which the heat sink 1' is mounted) and on a diagonal line because of a structure in which both tips of the wire spring 41' are hooked to the anchors 5'. Therefore, an effective area of the circuit board B tends to further decrease. Consequently, although the areas are secured to set the anchors 5', the increase in the areas that cannot be used as a circuit is a significant factor of influence and limitation on circuit design.

Further, for example, work for forming the slit-like openings shown in FIG. 17(a) on the circuit board B is difficult work compared with work for opening circular holes. There is also room of improvement concerning labor and time required for machining (work).

CITATION LIST

Patent Literature

Patent Literature 1: Japanese Patent Laid-Open No. 2005-150192

SUMMARY OF INVENTION

Technical Problem

The present invention has been devised recognizing such a background and attempts a new structure for mounting a heat sink in which an anchor for directly or indirectly fastening a spring member on a circuit board is formed of, for example, a very small pin-shaped member, whereby thorough effective use of a substrate area is realized and easy and sure mounting operation for a heat sink body can be performed.

Solution to Problem

A structure for mounting a heat sink according to the present invention is a structure in which a heat sink body including a base compression-bonded to a semiconductor circuit element on a circuit board and heat radiation fins projecting from the base is mounted on the circuit board using a spring member, at least one anchor for mounting the heat sink body on the circuit board being provided on the circuit board in a projected state to a mounting side of the heat sink body and the spring member being directly or indirectly attached to the anchor to mount the heat sink body on the circuit board, characterized in that the anchor includes a base section fixed to the circuit board and a main body section projecting to the heat sink body side from the circuit board, and an attaching section to which the spring member is directly or indirectly attached is formed in the main body section, the main body section of the anchor is formed in a substantially columnar shape or a regular prism shape, and a structure for attaching the spring member to the anchor in mounting the heat sink body on the circuit board is a structure for directly or indirectly attaching the spring member to the attaching section of the anchor in an externally fit state.

The aforesaid structure for mounting the heat sink is further characterized in that in the anchor, the base section and the main body section are integrally formed and the attaching section is formed integrally with the main body section, and the attaching section is configured by a step formed by a small diameter section formed thinner than the main body section and a main body section on a tip side.

The structure for mounting the heat sink as described above is also characterized in that, in addition to the aforesaid features the main body section of the anchor is formed in a substantially columnar shape having a maximum diameter of about 1.7 mm.

A further feature of the disclosed structure for mounting the heat sink is that the anchor includes a flange extending to the outer circumferential side at an end of the base section, and, in setting the anchor on the circuit board, the anchor is fit in from the opposite side of a mounting surface of the heat sink.

The structure for mounting the heat sink is additionally characterized in that, attachment pieces formed separately from the spring member are provided at both ends of the spring member, and in mounting the heat sink body on the circuit board, mounting of the heat sink body is realized by attaching the attachment pieces to the anchor.

The structure for mounting the heat sink is also characterized in that, in addition to the features described the anchor set on the circuit board is provided on an inner side of a range in which the heat sink body is mounted.

According to another feature of the disclosed structure for mounting the heat sink the anchor is used also as a positioning section in mounting the heat sink body on the circuit board.

A still further feature of the structure for mounting the heat sink of the invention, is that a mounted state lock that prevents, in a state in which the heat sink body is mounted on the circuit board, movement of both ends of the spring member each directly or indirectly attached to an anchor is provided, and movement of the spring member set in the mounted state in a dismounting direction is prevented by the mounted state lock.

The structure for mounting the heat sink described herein is further characterized in that, in addition to the above features, the attachment pieces provided at both ends of the spring member are provided in a movable state with respect to the spring member.

The structure for mounting the heat sink of the invention is additionally characterized in that, at a stage before mounting the heat sink body on the circuit board, the position and the posture of the attachment pieces are changed with respect to the spring member to lock the attachment pieces to a part of the heat sink body to obtain a sub-assembled state in which the spring member is assembled to the heat sink body.

A heat sink of the invention is a heat sink in which a heat sink body including a base compression-bonded to a semiconductor circuit element on a circuit board and heat radiation fins projecting from the base is mounted on the circuit board using a spring member, characterized in that the heat sink body is mounted on the circuit board by the mounting structure of the invention as disclosed herein.

Advantageous Effects of Invention

The problems are solved by means of the configurations of the invention disclosed herein.

According to the invention, in the structure, the main body section of the anchor is formed in the substantially circular shape or the regular prism shape in plan view and the spring member is fastened to the anchor in an externally fit state (directly or indirectly). Therefore, it is possible to form the anchor (the main body section) extremely small, a setting space for providing the anchor only has to be a very small area, and effective utilization of a circuit board surface can be attained.

According to the invention, in the anchor, the base section and the main body section are integrally formed and the attaching section and the main body section are integrally formed. Therefore, for example, after the heat sink body is positioned, it is unnecessary to attach a member larger than the main body section to an anchor head to form the attaching section. After the positioning, it is possible to immediately operate the spring member to mount the heat sink body.

According to the invention, the anchor (the main body section) is formed in the substantially columnar shape having the maximum diameter of about 1.7 mm. Therefore, an attachment hole formed on the circuit board in order to fixedly set the anchor only has to have a very small hole size of about 1.7 mm. Therefore, a lost area and a lost shape on the circuit board involved in the setting of the anchor is suppressed to a circle having a diameter of about 1.7 mm or a square having the length of one side of about 1.7 mm (strictly, a brim-like flange section is also included in the lost area). The lost area is extremely small.

Note that the size and the setting area of the anchor are not such a very small size (a large size) in the past. This is considered to be because there is no way of fastening a wire spring in an externally fitting form. In a mounting method in the past, the wire spring is hooked to the anchor having the substantially U shape as explained above. Therefore, an area having a relatively elongated shape is indispensable to provide the anchors. On the other hand, in another mounting method such as push pins, a shape for providing anchors is not an elongated shape (area) and only has to be a circular shape. However, because the tips of the push pins are elastically deformed and attached, a certain degree or larger size (hole diameter) is necessary. Therefore, there is no idea of forming the anchors in a very small size.

According to the invention, the anchor including the flange formed in the base section is fit in (pres-fit) from the substrate rear surface and set. Therefore, when the heat sink is mounted, a tensile force (a pullout force) in a fitting direction acts on the anchor according to the elasticity of the spring member. However, the flange assumes an action of slip-off prevention. Therefore, it is possible to prevent the anchor from slipping off. Further, this contributes to sure mounting of the heat sink.

According to the invention, the attachment pieces are provided at both ends of the spring member and fastened to the anchor, whereby the heat sink is mounted. Therefore, compared with the case in which the spring member is directly fastened to the anchor, a movable range of operation ends (the attachment pieces) expands (a degree of freedom of movability increases), mounting work can be easily performed, and it is possible to quickly and accurately mount the heat sink.

According to the invention, the anchor is provided on the inner side of the heat sink body. Therefore, it is possible to more effectively utilize the substrate area.

According to the invention, the anchor for originally mounting (fixing) the heat sink is used also as the positioning section during the mounting. Therefore, it is unnecessary to separately provide a positioning section and it is possible to more effectively utilize the substrate area. Further, this contributes to a reduction in the number of members (a reduction in constituent members) as well.

According to the invention, the mounted state lock that maintains the mounted state is provided. Therefore, during the operation of an electronic device, it is possible to continuously maintain the heat sink in the mounted state. In other words, during the operation of the electronic device, vibration or the like involved in the operation is assumed. However, even if a certain degree of vibration is applied, it is possible to surely and firmly maintain the mounted state with the mounted state lock.

According to the invention, the attachment pieces are provided in the movable state with respect to the spring member. Therefore, for example, it is possible to provide the attachment pieces to be capable of sliding or pivoting with respect to the spring member. The movable range of the attachment pieces further expands (the degree of freedom of movability of the attachment pieces increases) according to the movement of the attachment pieces with respect to the spring member in addition to the movement (motion) due to bending, twisting, and the like by the spring member. It is easier to perform the operation (the mounting work) for attaching the attachment pieces to the anchor.

According to the invention, it is possible to assemble the spring member to the heat sink body prior to the mounting by changing the position and the posture of the attachment pieces provided in the spring member. Therefore, for example, before the heat sink is mounted on the circuit board, the spring member is not separated from the heat sink body. It is possible to prevent a loss of the spring member, leading to improvement of workability (improvement of assemblability) of the mounting work.

BRIEF DESCRIPTION OF DRAWINGS

FIG. 6 is a diagram of a heat sink in a second embodiment in which an attachment piece is provided in a movable state with respect to a spring member, wherein FIG. 6(a) is a perspective view showing, in particular, a form for forming the attachment piece to be capable of horizontally pivoting with respect to the spring member and FIG. 6(b) is a plan view schematically showing a mounting situation in this form.

DESCRIPTION OF EMBODIMENTS

Figure 1:
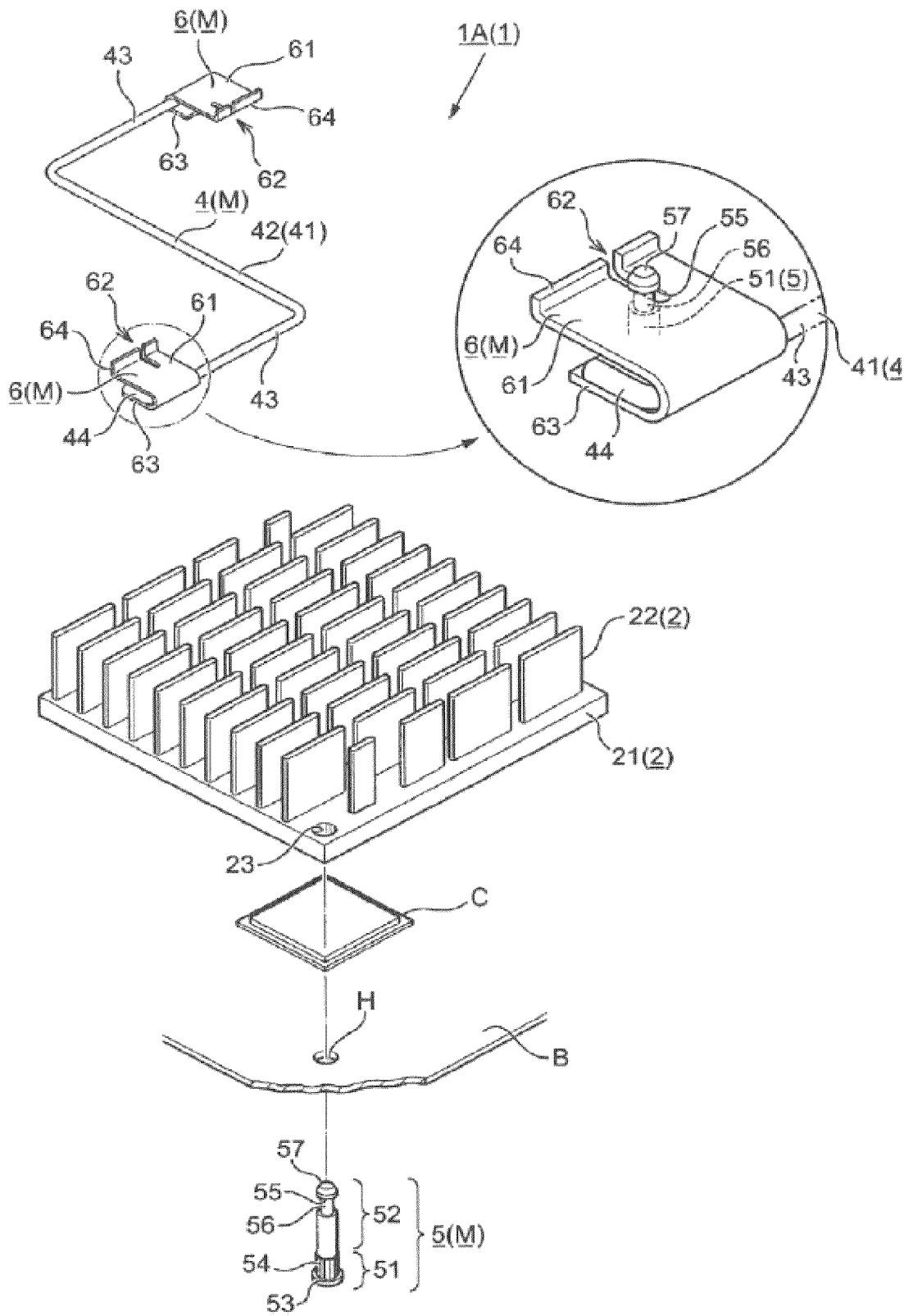
FIG. 1 is an exploded perspective view showing a heat sink (a first embodiment) according to the present invention.

Modes for carrying out the present invention include, as one of the modes, a mode described in embodiments below and further include various methods that can be improved in a technical idea of the present invention.

Note that, in the explanation, a circuit board B on which a heat sink 1 according to the present invention is mounted is explained first and, thereafter, a basic structure of the heat sink 1 is explained. Then, a mounting structure according to the present invention is explained while a mounting form of the heat sink 1 is explained.

The heat sink 1 according to the present invention is usually removably mounted on the circuit board B. First, the circuit board B on which the heat sink 1 is mounted is explained.

On the circuit board B, semiconductor circuit elements C such as a GPU unit, a chip set unit, and a CPU unit are mounted (loaded). Since the semiconductor circuit elements C generate heat according to the operation of an electronic device, the heat sink 1 is mounted in a compression-bonded state to the semiconductor circuit elements C, whereby efficient heat radiation from the semiconductor circuit element C is realized.

In the present invention, attachment pieces 6 formed separately from or integrally with a spring member 4 (a wire spring 41) are provided at both ends of the wire spring 41. The attachment pieces 6 are attached to anchors 5 by, for example, hooking the attachment pieces 6 to the anchors 5, whereby the heat sink 1 is mounted (fixed) on the circuit board B. In the present invention, the attachment pieces 6 (the spring member 4) is structured to be attached to the anchors 5 in an externally fit state. For example, a structure in which holes are opened in the anchors 5 and the attachment pieces 6 are fit in the holes is not adopted. Therefore, the anchors 5 can be formed in a small size. The anchors 5 are formed as columnar members having a substantially circular shape or a regular polygonal shape in plan view to restrict a plan-view shape thereof to small longitudinal and lateral dimensions. For example, when the anchors 5 are formed in a small pin shape (columnar shape/shaft shape), the anchors 5 are formed in a columnar shape having a diameter of about 1.7 mm.

Note that, in this specification, fixing the heat sink 1 on the circuit board B is referred to as "mounting" and a fixed state is referred to as "mounted state." In the following explanation, the heat sink 1 is explained dividedly as heat sinks 1 in first to fifth embodiments mainly according to forms of the attachment pieces 6 provided in the spring member 4. When the heat sinks 1 are distinguished in the embodiments, the heat sinks 1 in the first to fifth embodiments are respectively denoted by "1A," "1B," "1C," "1D," and "1E." Depending on the forms of the attachment pieces 6, forms of the anchors 5 are also sometimes different.

First Embodiment

As a basic form of the heat sink 1 (1A) in a first embodiment, the attachment pieces 6 are formed separately from the wire spring 41 and the attachment pieces 6 and the wire spring 41 are joined by welding or the like later. The heat sink 1A in the first embodiment mainly includes, as shown in FIG. 1 as an example, a heat sink body 2 that performs heat radiating action and mounting means M for mounting the heat sink body 2 on the circuit board B. These members are explained below.

The heat sink body 2 is formed of a material excellent in thermal conductivity and heat radiation properties such as aluminum. The heat sink body 2 has a basis structure in which a large number of heat radiation fins 22 are formed to be projected from a tabular base 21.

In the base 21, a surface on which the heat radiation fins 22 are not formed is a contact surface that is compression-bonded (closely attached) to the semiconductor circuit elements C. In general, a thermal conductive sheet for facilitating heat conduction is provided on the contact surface.

Note that, in this embodiment, positioning sections 23 used in mounting the heat sink 1 on the circuit board B are provided. Specifically, the anchors 5 set in a projected state from the circuit board B (the rear surface) are pierced through the base 21 to realize positioning of the heat sink 1. Therefore, the positioning sections 23 in this embodiment are combinations of the anchors 5 and holes for pierce-through formed in the base 21. Incidentally, reference sign H in the figure denotes attachment holes opened and formed in the circuit board B in order to fix (press-fit) the anchors 5.

In this embodiment, the anchors 5 are provided on the inner side of the heat sink body 2 (the inner side of a range in which the heat sink 1 is provided on the circuit board B). This is to prevent a substrate area from decreasing as much as possible and suppress limitation and the like on circuit design as much as possible. It goes without saying that if the anchors 5 pierce through the heat sink body 2 in this way, when the heat sink 1 is positioned on the circuit board B, an operator can easily view the heads of the anchors 5. Therefore, positioning work (mounting work) can be efficiently performed. Since the anchors 5 are provided on the inner side of the heat sink body 2, the heat radiation fins 22 in regions of the anchors 5 are naturally formed slightly small in, for example, a fin width dimension not to interfere with the positioning sections 23.

Next, the mounting means M is explained. As explained above, the mounting means M is the means for mounting the heat sink body 2 on the circuit board B. The mounting means M includes the spring member 4, the anchors 5, and the attachment pieces 6. It goes without saying that, when the heat sink body 2 is mounted as explained above, since, first, the heat sink body 2 is held by the positioning sections 23 not to shift from a regular position, the positioning sections 23 and other members related to the mounting are also included in the mounting means M. The spring member 4, the anchors 5, and the attachment pieces 6 are explained below.

The spring member 4 presses the heat sink 1 against the circuit board B side to mount the heat sink 1. As an example, as shown in FIG. 1, the wire spring 41 formed in a substantially Z shape in plan view is applied. Specifically, the wire spring 41 is a spring of a so-called torsion bar type. The wire spring 41 includes arm sections 43 on both sides of a center torsion section 42 in a center portion. The wire spring 41 presses the heat sink 1 against the circuit board B and mounting the heat sink 1 making use of a repulsive force generated when both arm sections 43 are twisted. In other words, the wire spring 41 acts to always urge the attachment piece 6 upward (in a projecting direction of the heat radiation fins 22).

In this embodiment, the center torsion section 42 is formed in a substantially straight bar shape and is formed to entirely press the heat sink 1 (the base 21) (the center torsion section 42 is entirely in contact with the base 21). However, the center torsion section 42 is not always limited to this form. For example, the center torsion section 42 can be formed in a substantially V shape to press the base 21 substantially at one point in the center of the center torsion section 42 (a so-called point contact state).

Tip sides of both arm sections 43 are folded back to be substantially parallel to the center torsion section 42 (fold-back sections 44). The arm sections 43 and the fold-back sections 44 are welded in a state in which the arm sections 43 and the fold-back sections 44 are held in the attachment pieces 6.

Note that, in the present invention, as the spring member 4, the wire spring 41 (a spring entirely formed of a linear member) is mainly illustrated. However, the spring member 4 is not always limited to the wire spring 41. Besides, a leaf spring (a single leaf spring), a tabular clip, and the like entirely formed of a tabular member can be applied.

Next, the anchors 5 are explained. As explained above, the anchors 5 are set in the projected state on the mounting surface side of the heat sink 1 on the circuit board B. The wire spring 41 is indirectly attached to the anchors 5, more specifically, the attachment pieces 6 provided at both ends of the wire spring 41 are hooked (attached) to the anchors 5, whereby the heat sink 1 is mounted.

In this embodiment, very small pin-like members formed in a substantially columnar shape are applied as the anchors 5. The dimension of the anchors 5 is about 1.7 mm as a maximum diameter of a shaft-like section projecting on the circuit board B. Since the anchors 5 are formed by the small pin-like members, there is an effect that a substrate area can be effectively used. Since the anchors 5 are formed in the columnar shape, the attachment holes H opened in the circuit board B in order to set the anchors 5 and the holes functioning as the positioning sections 23 formed in the base 21 may be formed in a circular shape. Therefore, hole opening work (hole opening machining) can be easily performed.

Such anchors 5 include, for example, as shown in FIG. 1, base sections 51 fixed to the circuit board B and main body sections 52 projecting on the circuit board B. Brim-like flanges 53 extending to the outer circumferential side are formed at ends (lower ends) of the base sections 51. The anchors 5 press-fit (fit) in the circuit board B from the substrate rear surface (the opposite side of the mounting surface of the heat sink 1) are prevented from slipping off by the flanges 53.

The base sections 51 include joining sections 54 that hit joining surfaces with the circuit board B. The base sections 51 are formed in substantially the same diameter dimension as the main body sections 52. Knurling or the like for increasing a fixing force for the anchors 5 press-fit in the circuit board B and intensifying slip-off prevention is applied to the joining sections 54 as appropriate.

Further, in this embodiment, attaching sections 55 for indirectly attaching the wire spring 41, i.e., hooking the attachment pieces 6 are formed in positions closer to the tips of the main body sections 52. The attaching sections 55 are substantially configured by steps formed by small diameter sections 56 formed slightly thinner than the main body sections 52 and the main body sections 52 on the tip side. In a broader sense, the attaching sections 55 include regions (anchor heads) above the steps. Therefore, a diameter dimension (a size) of the attaching sections 55 is a dimension equal to or smaller than the joining sections 54, i.e., same as or smaller than the joining sections 54. A diameter dimension (a size) in plan view of the anchors 5, a diameter dimension (a size) of the attachment holes H formed in the circuit board B in order to set the anchors 5, and the like are suppressed to very small dimensions.

Note that the tip side of the main body sections 52 of the anchors 5 is desirably formed in a slightly tapered shape (conical shape) taking into account improvement of insertion of the anchors 5 into the circuit board B and reception of the attachment pieces 6. The tip side is formed as reception tip portions 57.

Next, the attachment pieces 6 are explained. The attachment pieces 6 are provided in a fixed state at both ends of the wire spring 41 by, for example, caulking or spot welding. In this embodiment, the attachment pieces 6 are hooked to the attaching sections 55 of the anchors 5 to mount (fix) the heat sink 1 to the circuit board B. In other words, the attachment pieces 6 are not attached in a movable state (do not move) with respect to the wire spring 41 but can perform movement corresponding to bending and twisting of the wire spring 41. Therefore, in mounting work, a movable range is wider than a movable range obtained when the wire spring 41 is directly hooked to the anchors 5. Therefore, the mounting work is easily performed and the heat sink 1 can be surely mounted.

The attachment pieces 6 include, as shown in FIG. 1 as an example, flat main body sections 61 and held sections 63 continuously formed from the main body sections 61 to roll up the wire spring 41. The attachment pieces 6 are formed substantially U shape sections as a whole by these members. In other words, the attachment pieces 6 are formed to hold the wire spring 41 with the main body sections 61 and the held sections 63. Holding portions are, for example, caulked or welded to be fixed to the wire spring 41.

In the attachment pieces 6, opening sections 62 for receiving only the small diameter sections 56 of the anchors 5 and realizing hooking to the anchors 5 (the attaching sections 55) are formed. Further, fold-backs functioning as mounted state locks 64 are formed on a receiving side of the attachment pieces 6 (the opening sections 62 are formed to pierce through the fold-backs functioning as the mounted state locks 64).

Specifically, the attachment pieces 6 are always urged upward (the projecting direction of the heat radiation fins 22) by the elasticity of the wire spring 41. Therefore, in a state in which the small diameter sections 56 of the anchors 5 are fit in the opening sections 62 of the attachment pieces 6, as shown in the enlarged view of FIG. 1, end edges of the opening sections 62 come into contact with the steps (the attaching sections 55) of the anchors 5, the upward urging is prevented, and the attachment pieces 6 change to a mounted state in which the attachment pieces 6 are hooked (attached) to the anchors 5.

The fold-backs functioning as the mounted state locks 64 maintain the mounted state. Specifically, even if vibration or the like is applied to the attachment pieces 6 once changed to the mounted state and the attachment pieces 6 are about to move in a direction for releasing the mounting (a slip-off direction), the fold-backs come into contact with the attaching sections 55 (the anchor heads) to function as slip-off prevention. More specifically, to release the mounted state, the attachment pieces 6 have to be moved in the slip-off direction while being pushed down against the elasticity of the wire spring 41 (because only the passage of the small diameter sections 56 is allowed). The mounted state is not released by only the movement in the slip-off direction.

Figure 7:
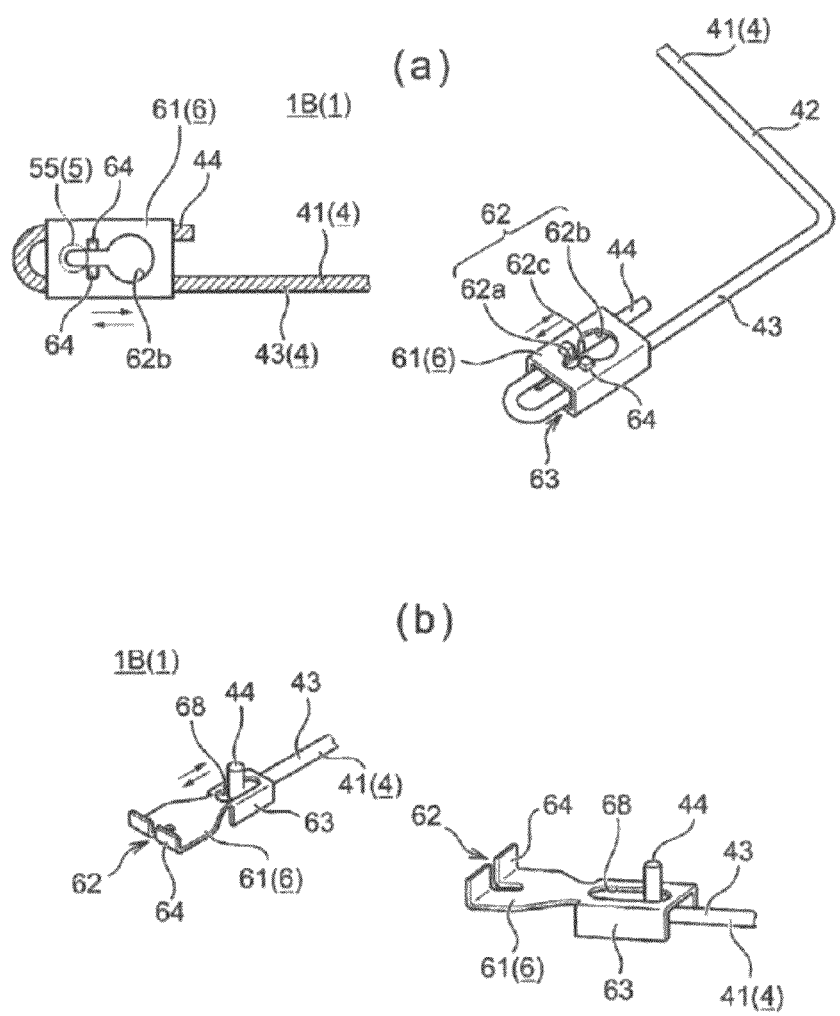
FIG. 7 is an explanatory diagram showing the heat sink in the second embodiment in which the attachment piece is provided in the movable state with respect to the spring member, in particular, two kinds of examples in which the attachment piece is formed to be capable of sliding with respect to the spring member.

The mounted state locks 64 are not limited to such fold-backs and may be protrusions obtained by projecting a part of the attachment pieces 6 themselves (see FIG. 7(a)).

A form of mounting the heat sink 1 on the circuit board B using the wire spring 41 provided with the attachment pieces 6 is explained below.

(1) Positioning

Figure 2:
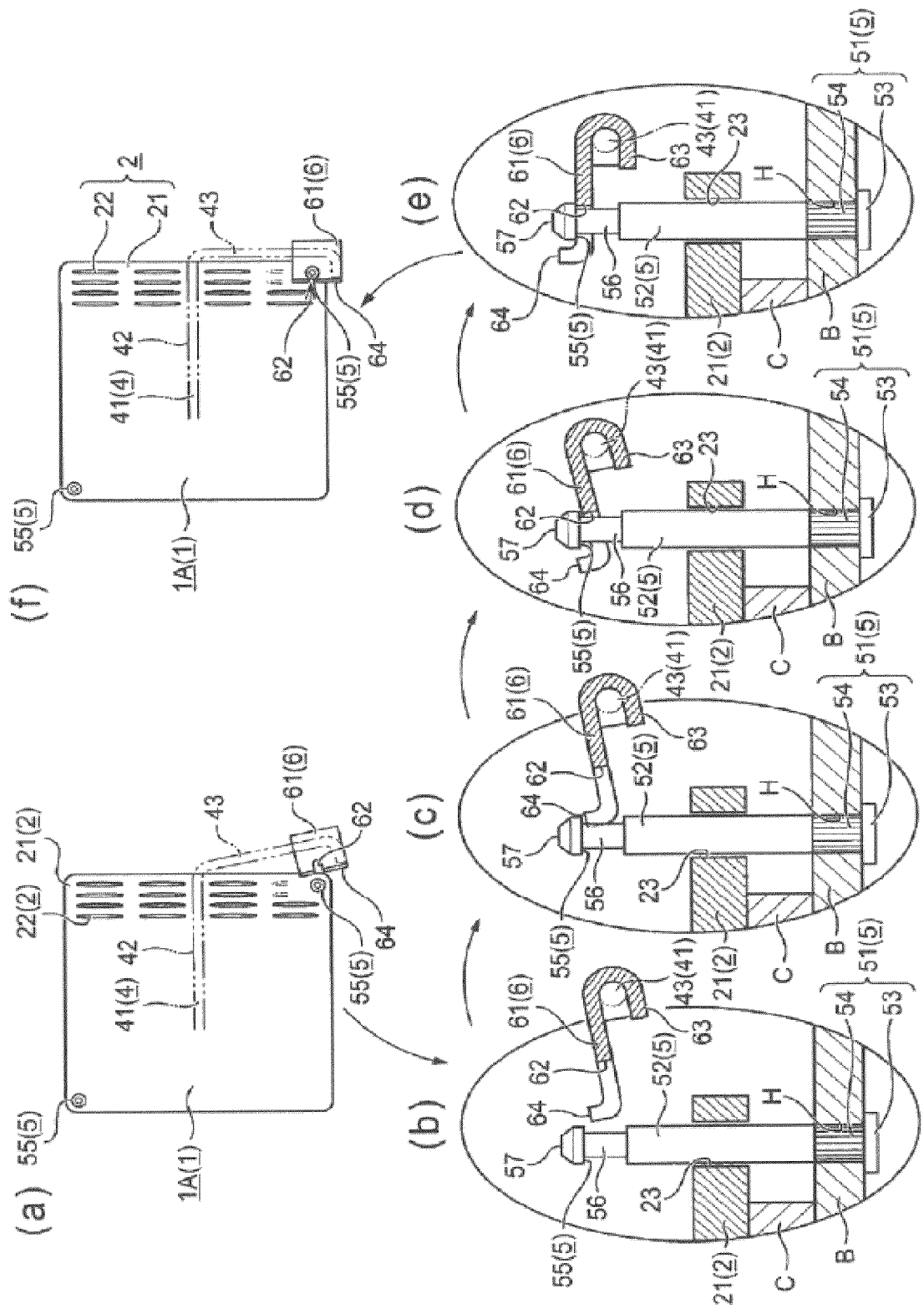
FIG. 2 is an explanatory diagram showing, in stages, mounting forms of the heat sink in the first embodiment.

In this embodiment, in mounting the heat sink 1, first, the heat sink body 2 is positioned on the circuit board B. To position the heat sink body 2, the heat sink body 2 is mounted on the circuit board B such that the anchors 5 provided to project on the circuit board B are fit in the positioning sections 23 (the holes) of the base 21. In particular, a solid line portion in FIG. 2(a) indicates the positioned heat sink body 2.

(2) Hooking of the Attachment Pieces to the Anchors

Thereafter, the wire spring 41 provided with the attachment pieces 6 at both ends is placed from above the heat sink body 2 and expanded to widen a dimension between the arm sections 43 while the attachment pieces 6 are pushed in downward. With this operation, in the attachment pieces 6, as shown in FIG. 2(b), the fold-backs functioning as the mounted state locks 64 reach positions lower than the attaching sections 55 (the anchor heads) of the anchors 5. In this state, as shown in FIG. 2(c), the attachment pieces 6 are moved to fit the small diameter sections 56 of the anchors 5 in the opening sections 62 of the attachment pieces 6.

As shown in FIG. 2(d), such movement of the attachment pieces 6 is continued until the innermost sections of the opening sections 62 come into contact with the small diameter sections 56. In this state, the fold-backs functioning as the mounted state locks 64 pass the attaching sections 55 (the anchor heads). According to such an operation form, the height dimension of the fold-backs functioning as the mounted state locks 64 is naturally set smaller than the length dimension of the small diameter section 56.

Thereafter, in a state in which the small diameter sections 56 are fit in the opening sections 62 of the attachment pieces 6, when the downward press applied to the attachment pieces 6 is released, as shown in FIGS. 2(e) and 2(f), the attachment pieces 6 are urged upward by the elasticity of the wire spring 41. However, since the end edges of the opening sections 62 come into contact with lower parts of the attaching sections 55 (the anchor heads), the heat sink 1 is mounted (fixed) on the circuit board B. In this way, in this embodiment, the attachment pieces 6 are caused to operate as if the attachment pieces 6 scoop up the attaching sections 55 (the anchor heads) to obtain the mounted state. The operation of the attachment pieces 6 is operation for finally fitting the attachment pieces 6 from the lateral direction of the anchors 5 (a substantially perpendicular direction with respect to the arm sections 43 of the wire spring 41).

(3) Mounted State Lock

In this mounted state, as shown in the enlarged view of FIG. 1 and FIGS. 2(a) and 2(f), the attaching sections 55 (the anchor heads) can come into contact with the fold-backs functioning as the mounted state locks 64. Therefore, this mounted state is maintained and locked. Specifically, even if the vibration or the like involved in the operation of the electronic device is applied to the heat sink 1 and, for example, the attachment pieces 6 are about to move in the slip-off direction, since the fold-backs functioning as the mounted state locks 64 come into contact with the heads (the attaching sections 55) of the anchors 5, such movement is prevented. Therefore, the heat sink 1 after being mounted on the circuit board B does not slip off the circuit board B. The wire spring 41 does not separate from the heat sink 1.

Figure 3:
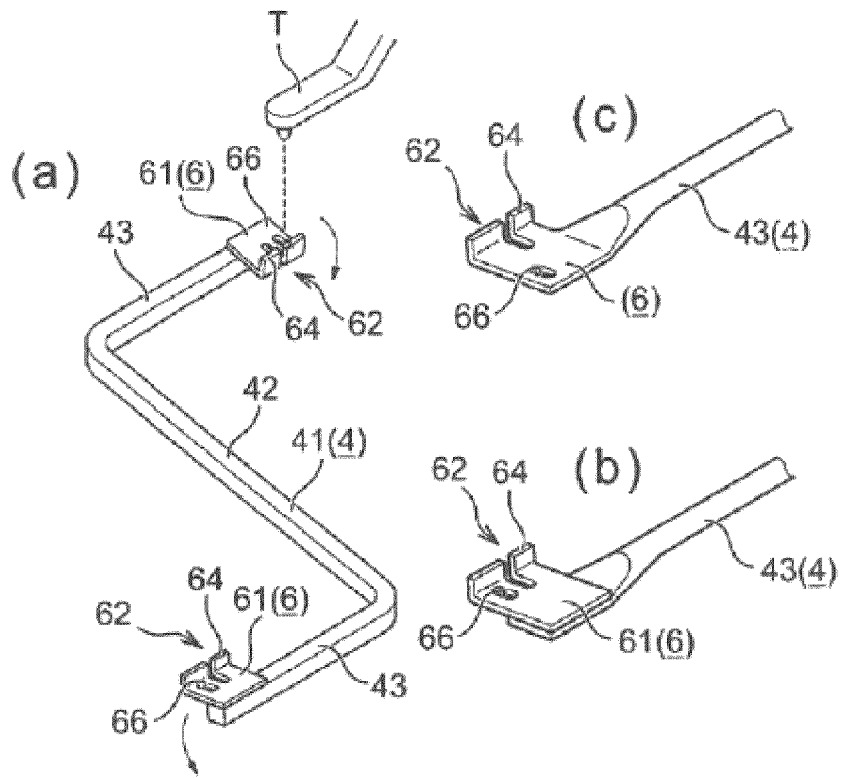
FIG. 3 is a perspective view showing, for example, an embodiment in which, in order to facilitate operation, holes for tools formed in attachment pieces provided at both ends of a wire spring and an embodiment in which the attachment pieces are directly formed at tip portions of the wire spring by plastic working.

To make it easy to perform the mounting operation explained above, for example, as shown in FIG. 3, it is desirable to form holes 66 for hooking tools T in the attachment pieces 6 in advance. Specifically, when the heat sink 1 is mounted on the circuit board B, for example, tips or the like of the tools T are inserted into the holes 66 of the attachment pieces 6 to make it easy to perform the pressing operation and expanding operation for the attachment pieces 6.

In an embodiment shown in FIG. 3(a), the wire spring 41 itself formed in a rectangular shape in section is shown. In an embodiment shown in FIG. 3(b), the tips of the normal wire springs 41 having a circular shape in section formed in a flat shape (plastic working) is shown. Both embodiments are configurations for securing wide joining surfaces between the attachment pieces 6 and the wire spring 41 and realizing sure joining among the members. It goes without saying that it is not always necessary to form the attachment pieces 6 separately from the wire spring 41 and may be formed integrally with the wire spring 41 from the beginning. In this case, for example, as shown in FIG. 3(c), the tips of the wire springs 41 are formed (machined) in a flat shape by the plastic working and formed as the attachment pieces 6. Incidentally, for example, when the attachment pieces 6 are formed integrally with the tips of the wire spring 41 or the tips of the wire spring 41 are formed to be directly hooked to the anchors 5, although not being formed like the attachment pieces 6, the wire spring 41 is directly hooked (attached) to the anchors 5.

Figure 4:
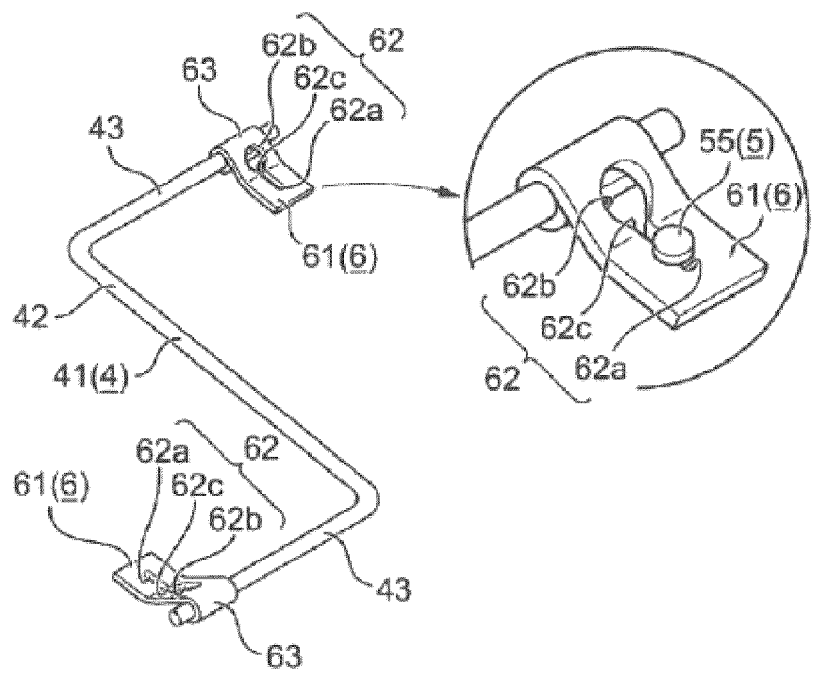
FIG. 4 is a perspective view showing a lock mechanism, which makes use of a level difference, as a mounted state lock other than a fold-back or a protrusion.

The mounted state locks 64 are not always limited to the fold-backs shown in FIG. 1 and the protrusions shown in FIG. 7(a). For example, as shown in FIG. 4, a structure that makes use of a level difference due to inclination (gradient) can also be adopted. Specifically, in FIG. 4, first, the attachment pieces 6 are formed to have inclination (gradient) when viewed from the side. Openings for hooking 62a for allowing only the passage of the small diameter sections 56 (not allowing the passage of the anchor heads) are formed in flat portions in low positions of the attachment pieces 6 and openings for pierce-through 62b for allowing pierce-through of the anchor heads are formed in high positions of inclined sections. The opening sections 62 are formed by connecting the openings for hooking 62a and the openings for pierce-through 62b with openings for communication 62c having a width dimension same as the width dimension of the opening for hooking 62a. In other words, in FIGS. 1 and 2, the tips of the attachment pieces 6 are formed in a half-cut shape by the opening sections 62 (equivalent to the openings for hooking 62a shown in FIG. 4). On the other hand, in FIG. 4, the opening sections 62 extending from the high positions to the low positions are formed in a closed state.

In this case, to obtain the mounted state, the attachment pieces 6 are pushed in to insert the attaching sections 55 (the anchor heads) through the openings for pierce-through 62b of the attachment pieces 6 and subsequently the attachment pieces 6 are moved in the mounting direction to cause the small diameter sections 56 to pass in the openings for communication 62c to locate the small diameter sections 56 in the openings for hooking 62a. Then, when the push-in of the attachment pieces 6 is released in this state, as in the embodiment shown in FIGS. 1 and 2, the attachment pieces 6 are urged upward (in the projecting direction of the heat radiation fins 22) by the elasticity of the wire spring 41. However, the end edges of the openings for hooking 62a of the attachment pieces 6 come into contact with (are hooked to) the attaching sections 55 (the anchor heads) of the anchors 5 from below to obtain the mounted state.

In such a mounted state, even if the attachment pieces 6 are about to move in a dismounting direction, the movement is difficult because the movement is action of the attaching sections 55 (the anchor heads) climbing the openings for communication 62c having a gradient shape (a slope, so to speak). Such a level difference functions as the mounted state locks 64.

Figure 5:
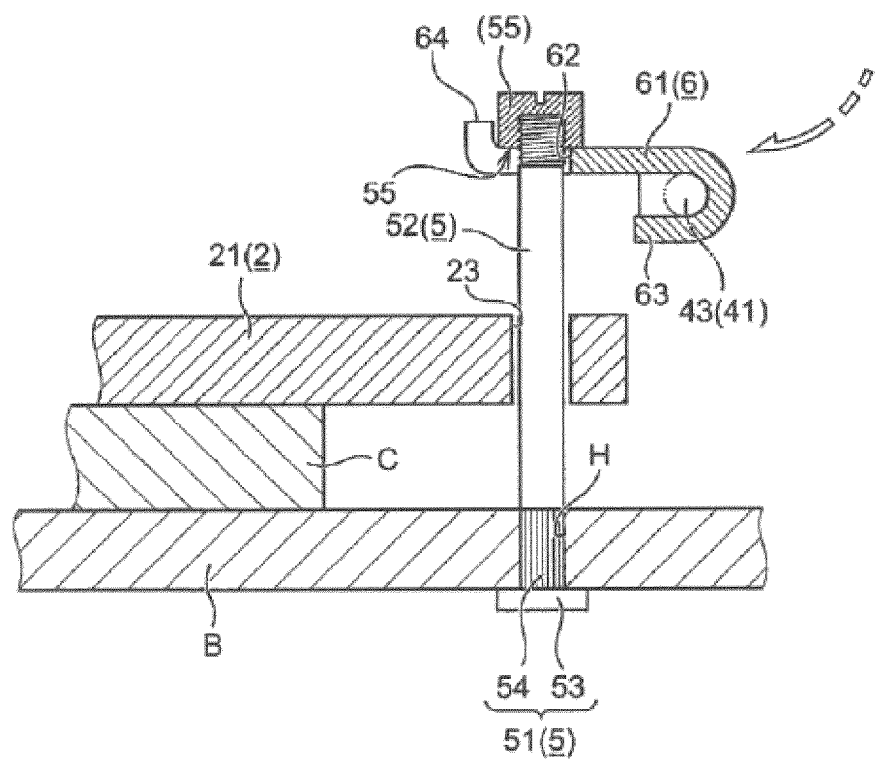
FIG. 5 is an explanatory diagram showing an embodiment in which an anchor head (an attaching section) is formed separately from a main body section and a base section and, after a heat sink body is positioned, the anchor head is fit in the anchor to form the attaching section (a step).

As the anchors 5, the attaching sections 55 (the anchor heads) may be formed separately from the main body sections 52 and the base sections 51 and fit in later. In this case, for example, as shown in FIG. 5, after the heat sink body 2 (the holes for the positioning sections 23) is fit in the anchors 5 (the main body sections 52) set on the circuit board B and positioned, the anchor heads are attached to the tips of the anchors 5 (the main body sections 52) (by screwing, etc.), whereby the attaching sections 55 are formed by the steps of the anchor heads and the main body sections 52 and the attachment pieces 6 are fit in the attaching sections 55 to mount the heat sink body 2. This embodiment can be considered as an embodiment in which the steps (the attaching sections 55) are formed without forming the small diameter sections 56 in the main body sections 52.

In this embodiment, it is important to perform management to prevent the anchor heads (the attaching sections 55) to be appended from being lost before the positioning stage and from being mixed with other members. However, it is unnecessary to form the small diameter section 56 in the main body section 52, in other words, the steps (the attaching sections 55) can be formed even if a part of the main body sections 52 are not formed thin. Therefore, in the design of the anchors 5, it is unnecessary to taken into account the rigidity and the durability of the small diameter sections 56.

Second Embodiment

Next, the heat sink 1 (1B) in a second embodiment is explained.

The heat sink 1B in the second embodiment basically follows the structure of the first embodiment. However, the heat sink 1B is different in points explained below. In the first embodiment, the attachment pieces 6 are provided in the fixed state with respect to the wire spring 41. However, in the second embodiment, the attachment pieces 6 are provided in a movable state with respect to the wire spring 41. The attachment pieces 6 are provided in the movable state with respect to the wire spring 41 in this embodiment because of consideration (intension) that a movable range further expands (a degree of freedom of movability increases) according to the movement of the attachment pieces 6 (movability with respect to the wire spring 41) in addition to the movement due to bending, twisting, and the like by the wire spring 41 and the mounting work can be more surely and more easily performed.

Figure 6:
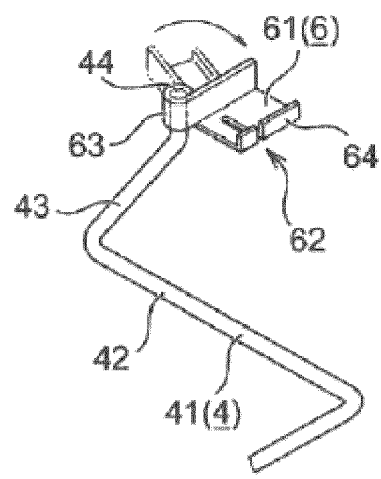
Figure 6:
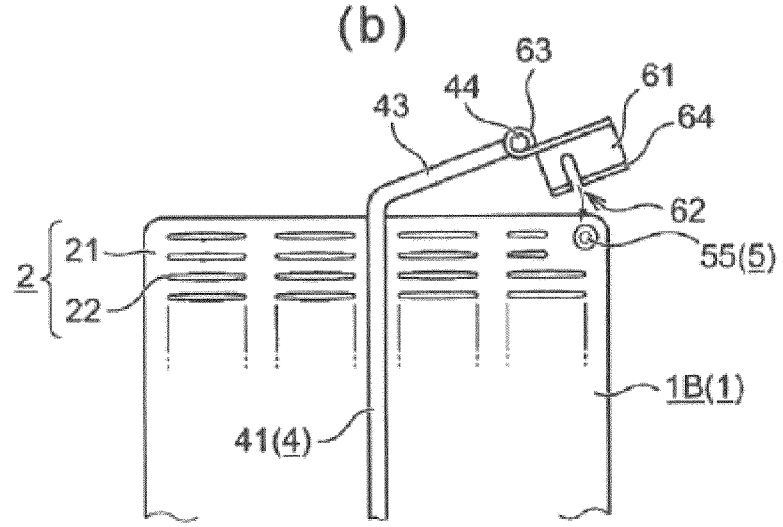

Examples of such a heat sink 1B include, for example, as shown in FIG. 6, a heat sink in which the attachment pieces 6 are provided to be capable of pivoting (horizontally pivoting) at the ends of the wire spring 41. In this case, in the wire spring 41, the fold-back sections 44 are formed in an erected state upward from the arm sections 43. On the other hand, in the attachment pieces 6, the held sections 63 are formed in a wound state to set the fold-back sections 44 in this erected state as pivoting shafts (horizontal turning shafts). Consequently, in particular, when the attachment pieces 6 are fit in from the lateral direction as in the first embodiment, it is easier to perform the mounting work (see FIG. 6(b)).

Examples of the heat sink 1B in the second embodiment include, for example, as shown in FIG. 7(a), a heat sink in which the attachment pieces 6 are provided to be capable of sliding along the arm sections 43 of the wire spring 41. In this case, the wire spring 41 is configured such that the fold-back sections 44 are formed to be bent along the arm sections 43, the attachment pieces 6 are formed to be fit in the two wire members from the outer side, and the attachment pieces 6 slide using the two wire members as track rails.

In the attachment pieces 6, the opening sections 62 same as the opening sections 62 shown in FIG. 4, i.e., the openings for hooking 62a, the openings for communication 62c, and the openings for pierce-through 62b are continuously formed. Further, protrusions functioning as the mounted state locks 64 are formed between the openings for hooking 62a and the openings for communication 62c.

To obtain the mounted state in this embodiment, as in the embodiment shown in FIG. 4, the small diameter sections 56 of the anchors 5 are fit in the openings for hooking 62a to obtain the mounted state. The protrusions functioning as the mounted state locks 64 can be brought into contact with the attaching sections 55 (the anchor heads) to maintain and lock the mounted state.

Incidentally, in this embodiment shown in FIG. 7(a), a form for mounting from the direction along the arm sections 43 (fitting the attachment pieces 6 into the anchors 5) is adopted. Therefore, this embodiment is different from the first embodiment and the embodiment shown in FIG. 6 in this point as well. In other words, if the first embodiment is the mounting from the lateral direction, in FIG. 7(a), the mounting can be considered mounting from, so to speak, the longitudinal direction different from the lateral direction by 90 degrees.

The wire members functioning as the slide rails can be formed by, for example, one wire member (the arm section 43) as shown in FIG. 7(b). In this case, if the fold-back section 44 is formed in the erected state upward and an opening for slide 68 for receiving the fold-back section 44 is also formed in the attachment piece 6, it is possible to regulate a slide stroke of the attachment piece 6 according to the length of the opening.

In FIG. 7(b), the tip of the attachment piece 6 (the tip including the fold-back functioning as the mounted state lock 64) is formed in a half-cut shape. During mounting, the attachment piece 6 scoops up the attaching section 55 (the anchor head) to obtain the mounted state.

Third Embodiment

Next, the heat sink 1 (1C) in a third embodiment is explained.

Figure 8:
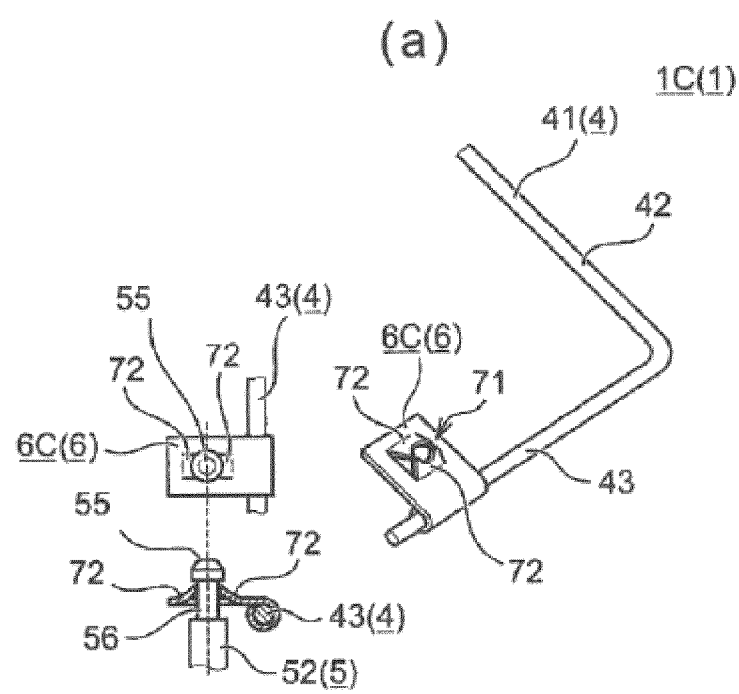
FIG. 8(a) is an explanatory diagram showing a third embodiment in which an attachment piece is a push nut type and FIG. 8(b) is an explanatory diagram showing a state in which a mounting force for the heat sink is adjusted according to a push-in amount of the attachment piece in the embodiment.
Figure 8:
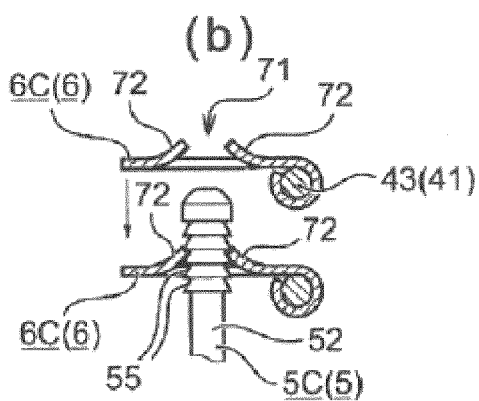

The heat sink 1C in the third embodiment includes, as shown in FIG. 8(a) as an example, the attachment pieces 6 of a push nut type. The attachment pieces 6 are forcibly fit in the attaching sections 55 (the anchor heads) of the anchors 5 to mount the heat sink body 2. The attachment pieces 6 of the push nut type in this embodiment are different from the embodiments 1 and 2 in the structure and a mounting form (a fitting form) of the attachment pieces 6. Therefore, the attachment pieces 6 are hereinafter referred to as "attachment pieces 6C" following the end sign of the heat sink 1C.

In the attachment pieces 6C in this embodiment, because of the structure explained above, insertion holes 71 fit over the attaching sections 55 of the anchors 5 therein are formed. Returns 72 having a reverse claw shape are formed on both sides of the insertion holes 71. To obtain the mounted state, the insertion holes 71 of the attachment pieces 6C are forcibly fit over the anchors 5 (the anchor heads). Consequently, the returns 72 catch the reverse claw shape from below the attaching sections 55 (the anchor heads) to prevent slip-off of the attachment pieces 6C.

When the attachment pieces 6C of the push nut type are used, as shown in FIG. 8(b), if the attaching sections 55 functioning as hooking steps are formed in the main body sections 52 in a plurality of stages, it is possible to adjust a pressing force of the wire spring 41, i.e., a mounting force of the heat sink body 2 by selecting a push-in amount for inserting (fitting in) the attachment pieces 6C. It goes without saying that, as the attachment pieces 6C are pushed in deeper, the heat sink body 2 is more firmly mounted. Reference sign 5C in the figure denotes an anchor in which the attaching section 55 is formed in a multiple stages.

Fourth Embodiment

Next, the heat sink 1 (1D) in a fourth embodiment is explained.

Figure 9:
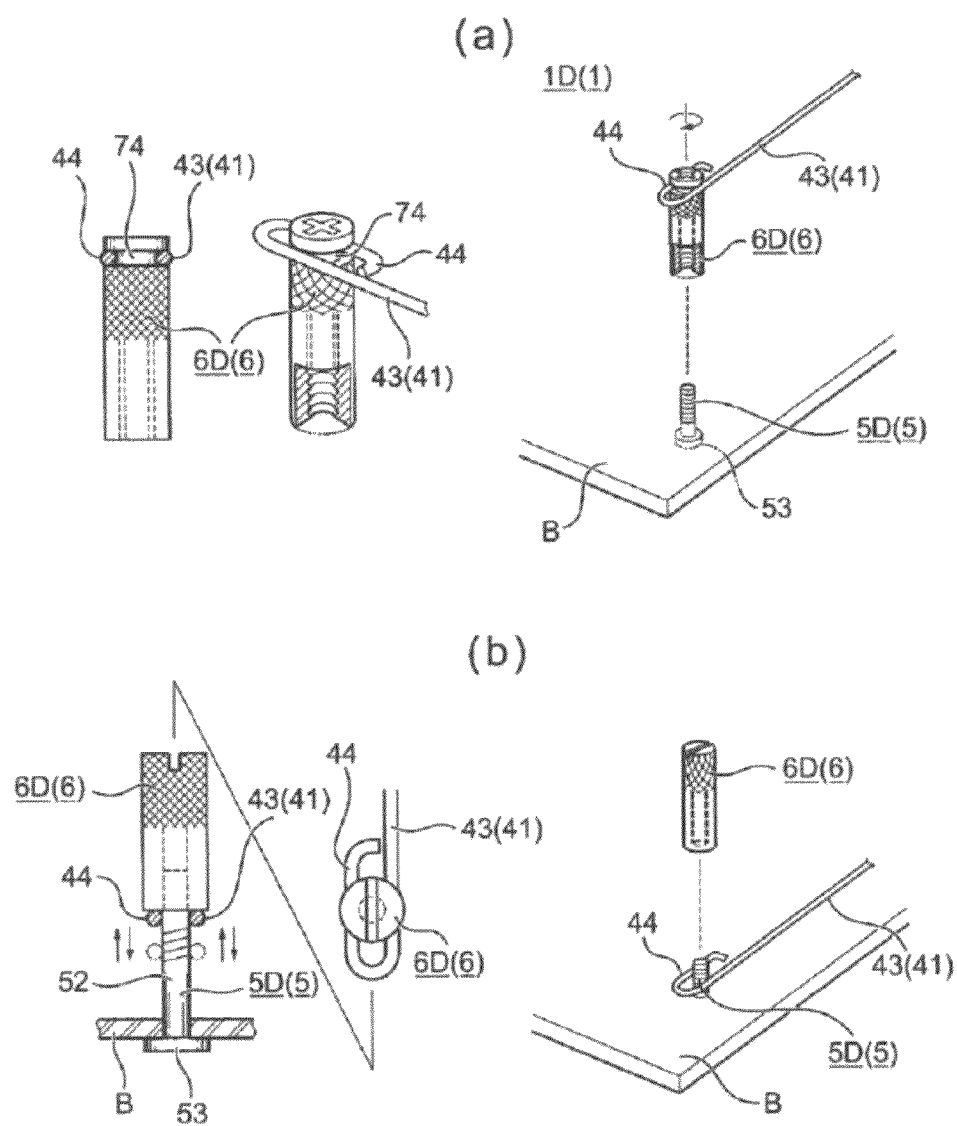
FIG. 9(a) is an explanatory diagram showing a fourth embodiment in which an anchor and an attachment piece are a bolt/nut type and FIG. 9(b) is an explanatory diagram showing a state in which a mounting force for a heat sink is adjusted according to a screw-in amount of the attachment piece of a nut type in the bolt/nut type in the embodiment.

The heat sink 1D in the fourth embodiment adopts, as shown in FIG. 9(a) as an example, a form of a bolt/nut type as the anchors 5 and the attachment pieces 6. The heat sink 1D is attached and fixed by screwing. Specifically, the anchors 5 are anchors of a bolt type (specifically denoted by reference sign 5D) and the attachment pieces 6 are attachment pieces of a nut (high nut) type (specifically denoted by reference sign 6D).

In this case, for example, grooves 74 are formed in the outer circumferential portions near the body tops of the attachment pieces 6D of the nut type. The grooves 74 are connected to be held by the arm sections 43 and the fold-back sections 44 of the wire spring 41. Consequently, the attachment pieces 6D can be provided to be capable of rotating with respect to the wire spring 41.

In this embodiment, a preset form is adopted in which the attachment pieces 6D are assembled to the wire spring 41 beforehand. Consequently, it is possible to prevent the attachment pieces 6D, which are small-size components, from separating from the wire spring 41 and prevent a loss of the attachment pieces 6D. It goes without saying that, in the preset form, for example, when several kinds of the heat sinks 1 have to be mounted, it is possible to prevent the attachment pieces 6D of different specifications from being mixed.

In this embodiment, it is desirable to apply knurling to side surface portions of the attachment pieces 6D to make it easy to screw in the attachment pieces 6D manually (with manual operation). More desirably, if cross-shaped holes or the like are formed in the heads of the attachment pieces 6D and the attachment pieces 6D are screwed in using an electric driver or the like, it is possible to more efficiently perform the mounting operation. It goes without saying that, in such a bolt/nut type, as in the case of the push nut type in the third embodiment, it is possible to adjust a pressing force (a mounting force for the heat sink body 2) by adjusting a screw-in amount of the attachment pieces 6D of the nut type. Moreover, it is possible to perform non-step adjustment.

The attachment pieces 6D of the nut type and the wire spring 41 do not always need to be preset before mounting and may be completely separated until a mounting stage. In this case, for example, as shown in FIG. 9(b), it is possible to, after first winding the ends of the wire spring 41 around the anchors 5D of the bolt type, i.e., setting the wire spring 41 to hold the anchors 5D between the arm sections 43 and the fold-back section 44, screw the attachment pieces 6D of the nut type over the anchors 5D from above to mount the heat sink 1D.

Such a form is a form for directly pushing in (screwing in) the wire spring 41 with the attachment pieces 6D. Therefore, a mounting force is stronger than the mounting force in the embodiment shown in FIG. 9(a). Therefore, it is considered to be easy to perform pressing force control (mounting force adjustment for the heat sink body 2) by the screwing amount adjustment for the attachment pieces 6D.

Incidentally, if the anchors 5D of the bolt type are used as in this embodiment, the main body sections 52 projecting on the circuit board B are formed in a columnar shape with almost no unevenness (including microscopic screw grooves) and the attaching sections 55 are formed in a diameter dimension (a size) substantially equal to the joining sections 54.

Fifth Embodiment

Next, a heat sink 1 (1E) in a fifth embodiment is explained.

In the heat sink 1E in the fifth embodiment, the attachment pieces 6 are provided in a movable state with respect to the wire spring 41. By the position setting (the posture setting) of the attachment pieces 6, the wire spring 41 is integrally assembled to the heat sink body 2 at a stage before the heat sink 1E is mounted on the circuit board B (so-called sub-assembling). This prevents the spring members 4 from separating from and coming off the heat sink 1E when the heat sink 1E is supplied to a mounting process (a final assembling process). Consequently, it is possible to more efficiently perform the mounting work.

Note that, in this specification, as explained above, attaching (fixing) the heat sink 1 (1E) on the circuit board B is referred to as "mounting" and the attached state is referred to as "mounted state". On the other hand, attaching (accompanying) the spring member 4 to the heat sink 1 (1E) beforehand is referred to as "assembling" or "sub-assembling" and an assembled state is referred to as "sub-assembled state."

Differences from the first embodiment are explained below.

Figure 10:
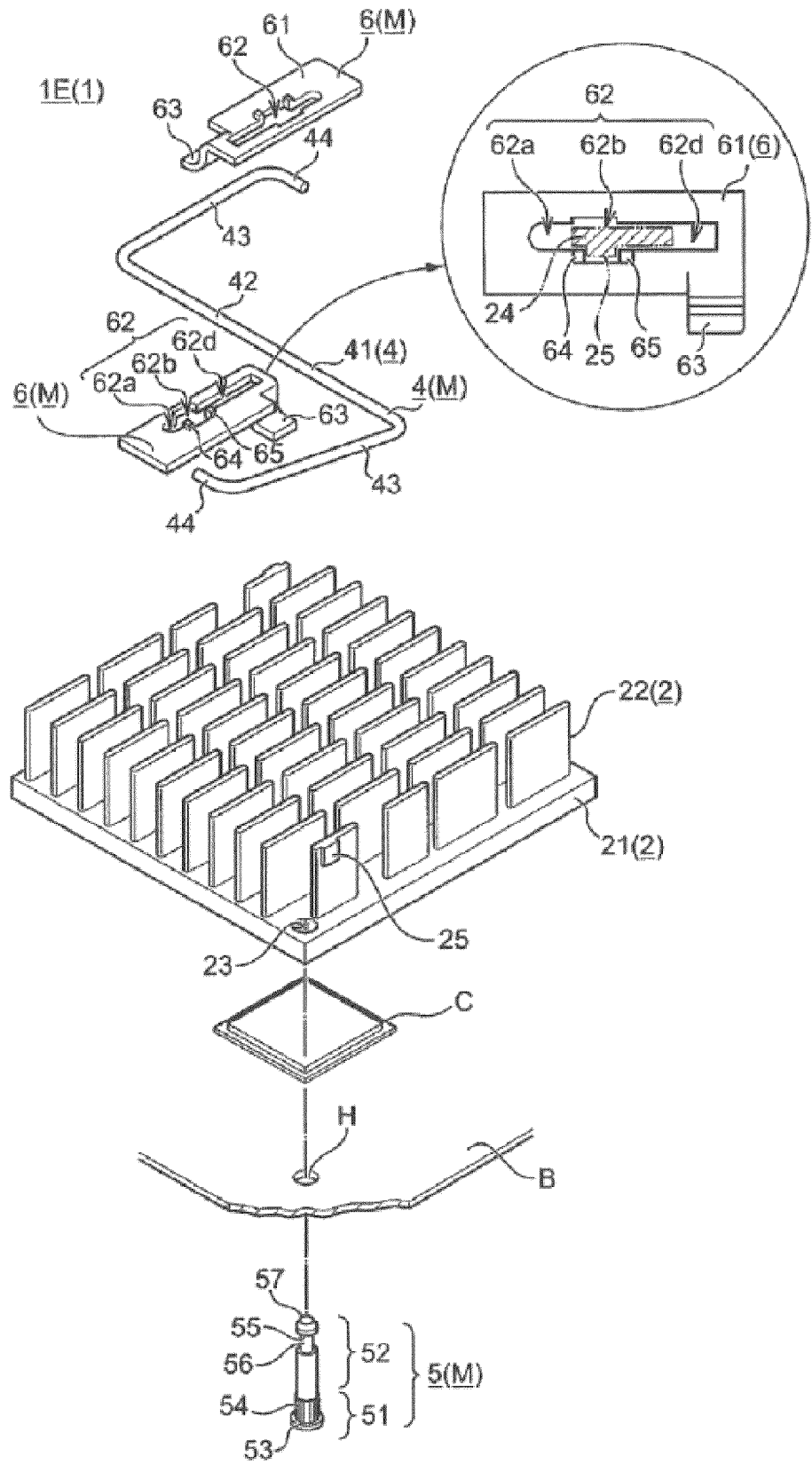
FIG. 10 is an exploded perspective view showing a heat sink in a fifth embodiment in which, at a state before mounting, a spring member is sub-assembled in a heat sink body by attachment pieces provided in a movable state at both ends of the spring member.

In this embodiment, as in the first embodiment, for example, as shown in FIG. 10, the anchors 5 are provided on the inner side of the heat sink 1E and used as positioning sections as well. Therefore, holes for the positioning sections 23 are formed in the heat sink body 2. Naturally, the heat radiation fins 22 are formed slightly small in, for example, a fin width dimension not to interfere with the positioning sections 23. In this embodiment, movability (movement) in the up-down direction of the attachment pieces 6 is regulated by the heat radiation fins 22, the fin width dimension of which is formed slightly small. The heat radiation fins 22 formed in the slightly small fin width dimension are posts 24.

Figure 11:
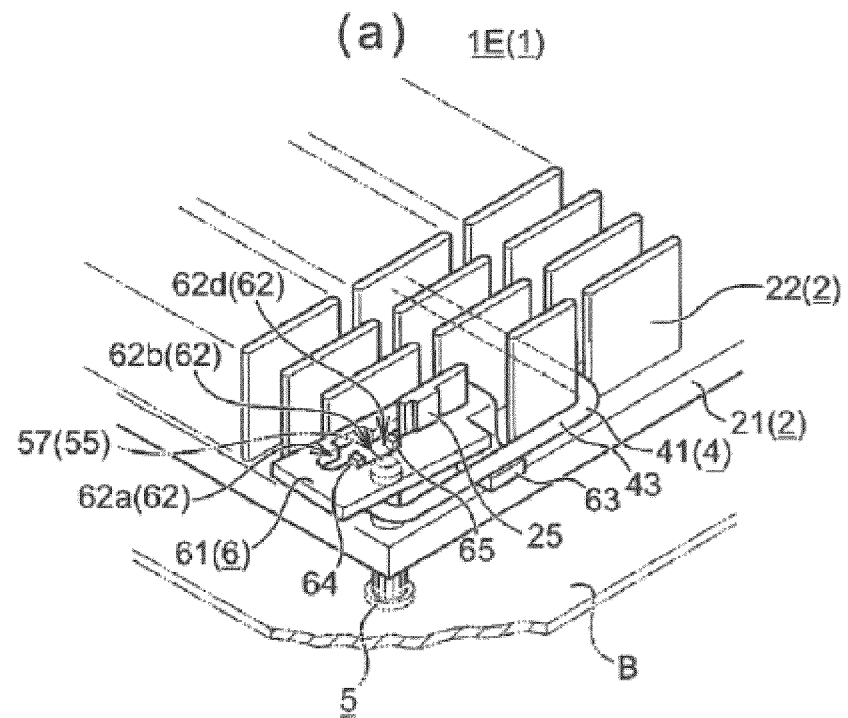
FIG. 11(a) is a perspective view showing a sub-assembled state of the heat sink in the fifth embodiment and FIG. 11(b) is a perspective view showing a mounted state.
Figure 11:
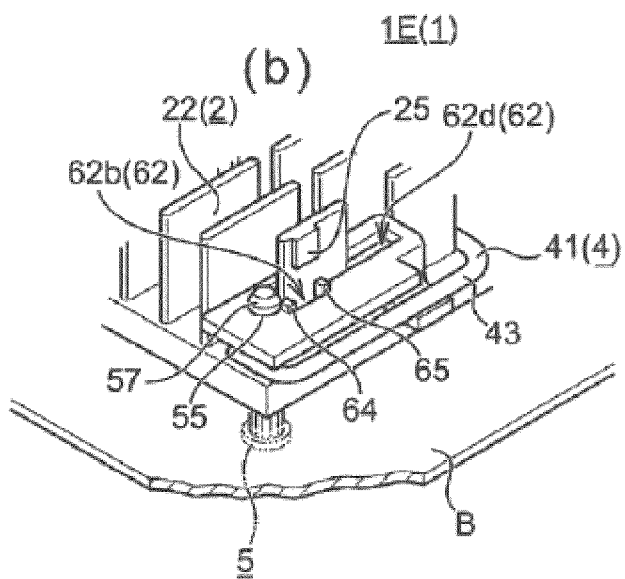

Locking projections for assembly 25 locked to the attachment pieces 6 in a sub-assembled state (a state not mounted on the circuit board B) are formed in the posts 24. The locking projections for assembly 25 are formed by projecting a part of upper end portions of the posts 24 to the outer side. As shown in FIG. 11(a), the attachment pieces 6 urged upward (the projecting direction of the heat radiation fins 22) are pressed by lower end portions (steps) of the locking projections for assembly 25 to obtain the sub-assembled state. In other words, the wire spring 41 formed completely separately from the heat sink body 2 is assembled to the heat sink body 2 by locking the attachment pieces 6 to the locking projections for assembly 25 of the post 24 while causing the wire spring 41 to hold the attachment pieces 6.

As explained above, the attachment pieces 6 are held (connected) in the movable state with respect to the wire spring 41. This is to change the position and the posture of the attachment pieces 6 locked to the locking projections for assembly 25 in the sub-assembled state to release the locking and further hook the attachment pieces 6 to the attaching sections 55 (the anchor heads) of the anchor 5 to set the heat sink 1E in the mounted state. It goes without saying that, when the attachment pieces 6 are in the sub-assembled state, i.e., the state in which the attachment pieces 6 are locked to the locking projections for assembly 25, the locking to the anchors 5 is released.

Incidentally, for example, in the sub-assembled state, the attachment pieces 6 are provided between the wire spring 41 and the heat sink body 2. "Between" in this context means a middle as a progress of action in application and transmission of force in the spring member 4, the attachment pieces 6, and the heat sink body 2 (the locking projections for assembly 25) and does not simply indicate a positional relation and a setting place in the sub-assembled state and the like. In other words, for example, in the sub-assembled state, the attachment pieces 6 are always urged upward (in the projecting direction of the heat radiation fins 22) by the spring member 4. The attachment pieces 6 urged upward are locked to the heat sink body 2 (the locking projections for assembly 25) to obtain the state. "Between" means that the attachment pieces 6 are provided between the spring member 4 and the heat sink body 2 on a path of this force.

The proper use of the terms "lock" and "hook" in this specification is explained. "Lock" in this embodiment indicates a state in which the attachment pieces 6 are hooked to the locking projections for assembly 25 (the heat sink body 2) (the sub-assembled state). "Hook" indicates a state in which the attachment pieces 6 are hooked to the anchor 5 (the mounted state). Both states are states in which the upward urging acting on the attachment pieces 6 are prevented (regulated). There is no clear distinction (strict distinction) in terms of hooking the attachment pieces 6 to realize joining. For easy understanding, "lock" and "hook" are distinguished according to the sub-assembled state and the mounted state and, plainly speaking, an object engaged by the attachment pieces 6. However, in general, in the mounted state in which the heat sink 1E is fixed on the circuit board B, the state has to be substantially completely prevented from being easily (carelessly) released. Therefore, the mounted state in which the mechanism (the shapes) hooked to each other are actively provided in the attachment pieces 6 and the anchors 5 to show strong hooking is referred to as "lock."

In this embodiment, concerning the attachment pieces 6, a form of the held sections 63 is different from the form in the first embodiment. Specifically, as shown in FIG. 10 as an example, the held sections 63 are formed of parts of the main body sections 61 curved to be substantially parallel to the flat main body sections 61. The wire spring 41 (mainly the arm sections 43) are received between the main body sections 61 and the held sections 63 in a held state to enable the attachment pieces 6 to slide along the arm sections 43.

In the attachment pieces 6, the openings for hooking 62a for allowing the passage of only the small diameter sections 56 of the anchors 5 (preventing the passage of the anchor heads), the openings for pierce-through 62b for allowing the passage of the locking projections for assembly 25 of the posts 24 and the main body sections 52 of the anchors 5, and the openings for locking 62d for preventing the passage of the locking projections for assembly 25 are formed. More specifically, the openings for hooking 62a and the openings for locking 62d are formed on both sides of the openings for pierce-through 62b to continue to the openings for pierce-through 62b.

The opening sections 62 are explained more in detail. The openings for hooking 62a are formed in an elliptical shape larger than the small diameter sections 56 of the anchors 5 and smaller than the main body sections 52, i.e., in a size in which only the small diameter sections 56 can be fit. Therefore, the end edges of the openings are hooked to the attaching sections 55 (see FIG. 11(b)) to prevent the passage of the main body sections 52 (the mounted state). The openings for pierce-through 62b are opened in a rectangular shape larger than the locking projections for assembly 25 and the main body sections 52 of the anchors 5 and formed to allow the passage of the locking projections for assembly 25 and the main body sections 52 of the anchors 5. The openings for locking 62d are formed in an oblong shape that can allow the passage of only portions of the posts 24 where the locking projections for assembly 25 are not formed. The openings for locking 62d are formed such that end edges of the openings are locked to the locking projections for assembly 25 (see FIG. 11(a)) to prevent the passage of the locking projections for assembly 25 (the sub-assembled state).

In the attachment pieces 6, protrusions are formed on both sides of the openings for pierce-through 62b (both sides of the end edges of the openings). The protrusions formed in boundary portions between the openings for pierce-through 62b and the openings for hooking 62a perform action for preventing slide of the attachment pieces 6 hooked to the attaching sections 55 (the anchor heads) of the anchors 5 (see FIG. 11(b)). The protrusions function as the mounted state locks 64 for maintaining the mounted state. On the other hand, the protrusions formed in boundary portions between the openings for pierce-through 62b and the openings for locking 62d prevent the attachment pieces 6 locked to the locking projections for assembly 25 from sliding in the width direction of the heat radiation fins 22 (see FIG. 11(a)). The protrusions function as sub-assembled state locks 65 for maintaining the sub-assembled state.

A mounting form of the heat sink 1E in the fifth embodiment is explained below. In the explanation, a sub-assembling stage in which the wire spring 41 is simply assembled to the heat sink body 2 (a state in which the heat sink 1E is not mounted on the circuit board B), a stage in which the heat sink body 2 after the sub-assembling is positioned on the circuit board B, and a stage in which the heat sink body 2 is mounted on the circuit board B, i.e., a stage until the heat sink 1E positioned on the circuit board B is actually mounted are separately explained.

(1) Sub-Assembling

To realize the sub-assembling, while the arm sections 43 of the wire springs 41 are caused to hold the attachment pieces 6, as shown in an enlarged plan view of FIG. 10, the attachment pieces 6 are fit in the posts 24 using the openings for pierce-through 62b and the openings for locking 62d while being pressed against the elasticity of the wire spring 41. When the attachment pieces 6 are fit in the posts 24, the attachment pieces 6 are fit in such that the locking projections for assembly 25 is stored in the openings for pierce-through 62b in plan view.

If the openings for pierce-through 62b (strictly, the sub-assembled state locks 65) reach positions lower than the locking projections for assembly 25 according to the fitting of the attachment pieces 6, the attachment pieces 6 can be slid along the posts 24 and the arm sections 43. Therefore, the attachment pieces 6 are moved (slid) such that the sub-assembled state locks 65 (the protrusions) pass through under the locking projections for assembly 25. The downward pressing of the attachment pieces 6 is released. According to the pressing release, the attachment pieces are urged upward by the wire spring 41. However, as shown in FIG. 11(a), the end edges of the openings for locking 62d are locked to the locking projections for assembly 25 and the upward urging of the attachment pieces 6 is prevented. In the sub-assembled state, since the attachment pieces 6 are fixed in such a state, as a result, the attachment pieces 6 acts to press both end portions of the wire spring 41. Consequently, the wire spring 41 is assembled to the heat sink body 2.

Note that such movement for sliding (laterally moving) the attachment pieces 6 fit in the posts 24 to form the attachment pieces 6 as the sub-assembling (in FIG. 11(a), movement in the lower left direction) is referred to as "movement (slide) in a sub-assembling direction."

In the sub-assembled state, by the sub-assembled state locks 65 (the protrusions), slide of the attachment pieces 6 in a direction for releasing the locked state, i.e., slide for matching the openings for pierce-through 62b to the locking projections for assembly 25 is prevented. Therefore, the sub-assembled state is maintained. Specifically, the wire spring 41 is sub-assembled with the heat sink body 2 by the attachment pieces 6 and supplied to the mounting process (the final assembling process). However, even if vibration involved in conveyance or the like is applied during the supply and, for example, the attachment pieces 6 are about to slide in the direction for releasing the locked state, since the sub-assembled state locks 65 (the protrusions) come into contact with the locking projections for assembly 25, such slide is prevented. Therefore, the attachment pieces 6 and the wire spring 41, which are sub-assembled, do not slip off the heat sink 1E during the supply.

(2) Positioning

Figure 12:
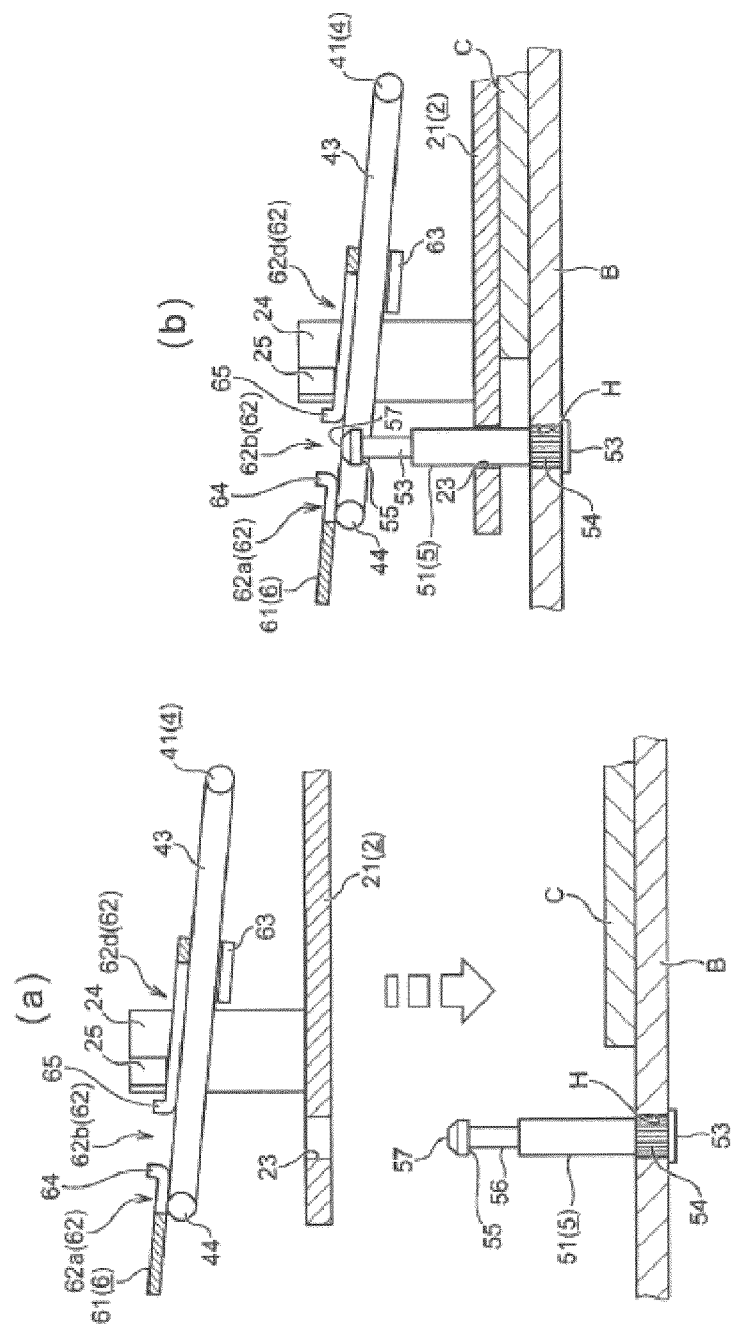
FIG. 12(a) is an explanatory diagram showing a state in which, in mounting the heat sink sub-assembled (the fifth embodiment) on a circuit board, the heat sink is positioned
FIG. 12(b) is an explanatory diagram showing a state after the positioning.

Further, in this embodiment, as shown in FIG. 12 as an example, the openings for pierce-through 62b of the attachment pieces 6 are formed to match the positioning sections 23 (the holes) of the heat sink body 2 in the sub-assembled state (the lock state). This is because, if the sub-assembled heat sink 1E is positioned in a fixed position on the circuit board B, the anchors 5 directly face the openings for pierce-through 62b to enable the positioning to immediately shift to the mounting process.

Specifically, to mount the heat sink 1E in the sub-assembled state (the lock state) on the circuit board B, first, as shown in FIG. 12(a), the positioning sections 23 (the holes) of the heat sink body 2 are fit over the anchors 5 fixed to the circuit board B, whereby positioning of the heat sink body 2 is performed. In this embodiment, according to this positioning (inserting) operation, as shown in FIG. 12(b), the anchors 5 (the reception tip portions 57) pierced through the positioning sections 23 (the holes) are located to face the openings for pierce-through 62b of the opening sections 62. It goes without saying that this positioning completed state is a state in which, as explained above, if the attachment pieces 6 are pushed in downward, the anchors 5 relatively ascend and directly pass through the openings for pierce-through 62b. In other words, in this embodiment, the sub-assembled state (the lock state) is an initial position in the mounting process.

As explained above, in this embodiment, the attachment pieces 6 locked in the sub-assembled state takes a positioned posture while keeping a posture in the sub-assembled state and is in the initial position in the mounting process. This has a substantial effect in improvement of assemblability. In other words, the wire spring 41 can be sub-assembled with the heat sink body 2 by the attachment pieces 6. This also realizes a reasonable effect. However, even in the sub-assembled state, if the attachment pieces 6 move in a free state, the positions of the attachment pieces 6 are made irregular (disordered). When the heat sink 1 is mounted on the circuit board B, first, initial positions of the attachment pieces 6 have to be set one by one. However, in this embodiment, such initial position setting for the attachment pieces 6 can be performed simultaneously with the sub-assembling (i.e., is unnecessary). Therefore, it is possible to more efficiently perform the mounting work for the heat sink 1E.

A form for mounting the heat sink 1E after the positioning on the circuit board B is explained.

(3) Mounting Form (After the Positioning)

After the heat sink 1E is positioned on the circuit board B, as shown in FIG. 13(a), the attachment pieces 6 are gradually pushed down (pushed in). According to such operation, when the attachment pieces 6 are separated from the lower ends of the locking projections for assembly 25, the locking (the contact) by the locking projections for assembly 25 is released.

Such push-in is further continued and, as shown in FIG. 13(b), when the sub-assembled state locks 65 (the protrusions) of the attachment pieces 6 reach positions lower than the lower ends of the locking projections for assembly 25, the lock in the sub-assembled state is completely released and the attachment pieces 6 can be freely slid. It goes without saying that, according to such downward push-in of the attachment pieces 6, the attaching sections 55 (the anchor heads) of the anchors 5 relatively ascend and reach positions higher than the openings for pierce-through 62b of the attachment pieces 6.

Figure 13:
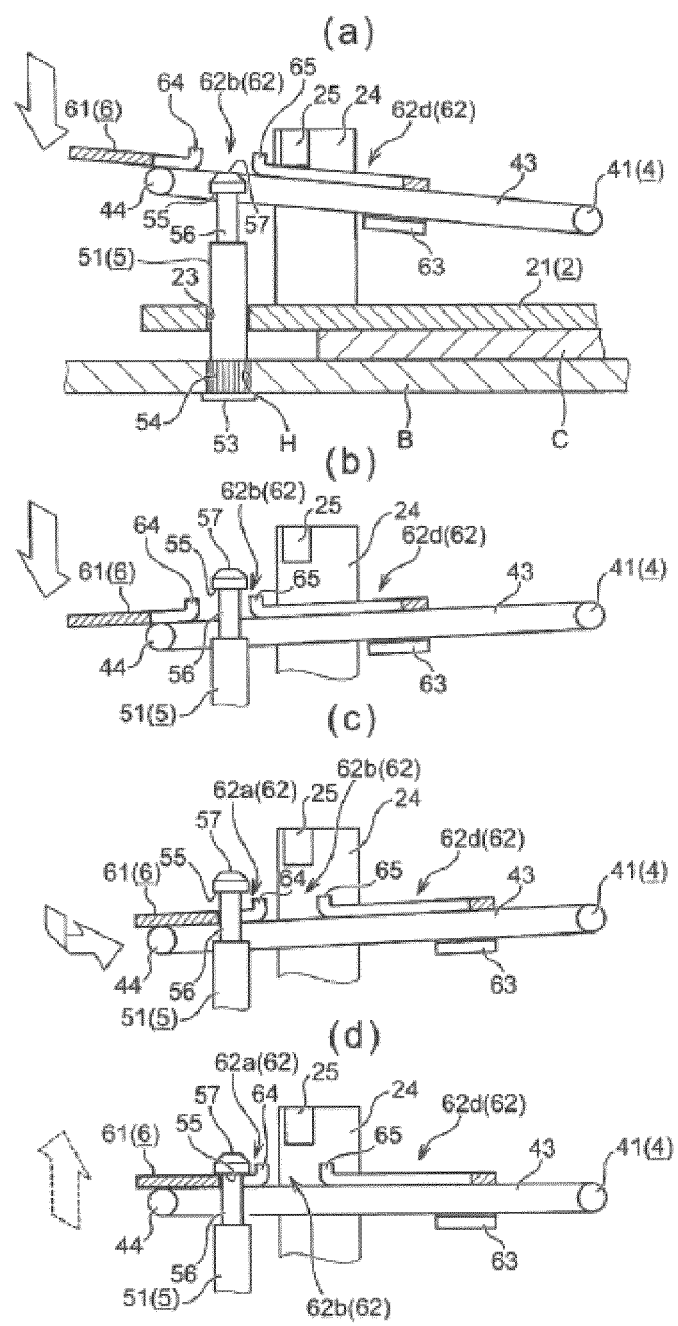
FIG. 13 is an explanatory diagram showing, in stages, a positioning state (a mounting starting state) to a mounted completed state on the circuit board concerning the heat sink (the fifth embodiment) positioned on the circuit board after being sub-assembled.

Thereafter, while the push-in of the attachment pieces 6 is maintained, the attachment pieces 6 are slid as shown in FIG. 13(c) (in FIG. 13, moved to the right side) and the openings for hooking 62a of the attachment pieces 6 are fit in the small diameter sections 56 of the anchors 5. It goes without saying that this state is a state in which the openings for hooking 62a of the attachment pieces 6 are located below the attaching sections 55 (the anchor heads) of the anchors 5. Moving the attachment pieces 6 in such a direction (a direction for forming the mounted state) is referred to as "movement (slide) in the mounting direction."

Thereafter, in this state (the state in which the small diameter sections 56 are fit in the openings for hooking 62a), when the downward push-in (push-down) applied to the attachment pieces 6 is released, as shown in FIGS. 13(d) and 11(b), the attachment pieces 6 ascend with the urging of the wire spring 41, the end edges of the openings for hooking 62a are hooked (closely attached) to the attaching sections 55 (the anchor heads) of the anchors 5 from below, and the state changes to the mounted state. An arrow of an ascending direction of the attachment pieces 6 is drawn by a broken line in FIG. 13(d). This is because this action is performed by the urging of the wire spring 41 without requiring artificial operation as explained above.

In this mounted state, as shown in FIGS. 11(b) and 13(d), the mounted state locks 64 (the protrusions) are located in the vicinities of the attaching sections 55 (the anchor heads) of the anchors 5 and prevent the movement of the attachment pieces 6 in the sub-assembling direction. Specifically, even if the vibration or the like involved in the operation of the electronic device is applied to the heat sink 1E and, for example, the attachment pieces 6 are about to slide in the sub-assembling direction, since the mounted state locks 64 (the protrusions) come into contact with the attaching sections 55 (the anchor heads) of the anchors 5, such slide is prevented. Therefore, the heat sink 1E, the mounting of which on the circuit board B is completed, does not come off the circuit board B. The attachment pieces 6 and the wire spring 41 do not separate from the heat sink 1E.

When the once-mounted heat sink 1E is removed from the circuit board B, the operation shown in FIG. 13 is performed in the opposite order to remove the heat sink 1E in the sub-assembled state shown in FIG. 13(a).

Other Embodiments

Figure 14:
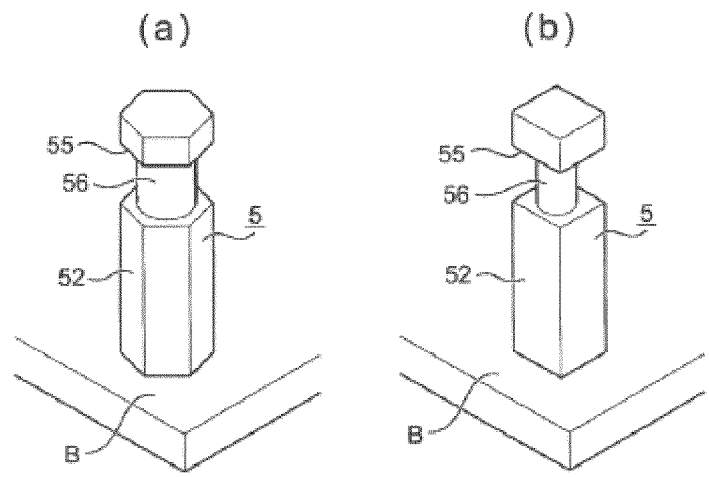
FIG. 14 is a perspective view showing another embodiment of an anchor (a main body section).

The present invention has the embodiments as a basic technical idea. However, modifications are possible as explained below. In all the embodiments shown in FIGS. 1 to 13, the anchors 5 are the very small anchors having the columnar shape. However, although it is important that the anchors 5 are small, it is also important that a plan view shape of the anchors 5 is not an elongated shape, i.e., a substrate area is not substantially lost. Therefore, for example, as shown in FIG. 14, the anchors 5 can also be formed as columnar members having a regular polygonal shape, i.e., formed in a regular polygonal shape in plan view.

Figure 15:
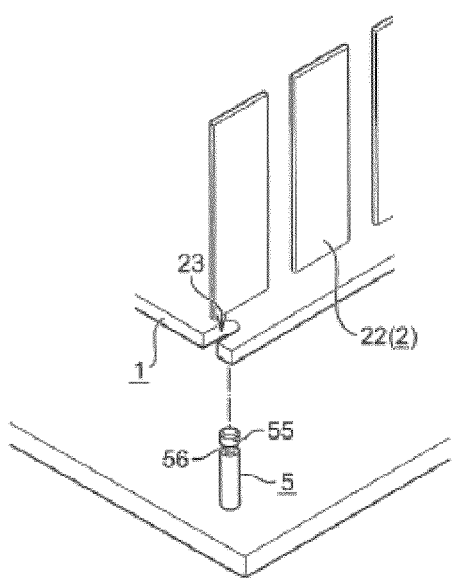
FIG. 15 is a perspective view showing another embodiment in which a positioning section formed in a heat sink body is formed in a groove shape.

In the embodiments shown in FIGS. 1 to 13, the positioning sections 23 for the heat sink 1 are the combinations of the anchors 5 fixed to the circuit board B and the holes for causing the anchors 5 to pierce through. However, the holes functioning as the positioning sections 23 can also be formed in, for example, a groove shape shown in FIG. 15.

In all the embodiments explained above, the anchors 5 are provided on the inner side of the heat sink 1 (the inner side of the range in which the heat sink 1 is mounted). However, the anchors 5 can also be provided on the outer side of the heat sink 1 (the outer side of an area in which the heat sink 1 is mounted).

Figure 16:
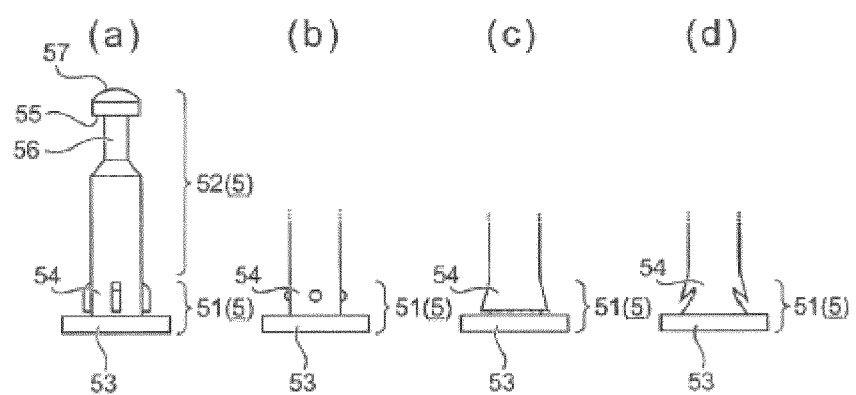
FIG. 16 is an explanatory diagram showing another embodiment other than knurling applied to a joining section in order to increase a fixing force of an anchor.
Figure 17:
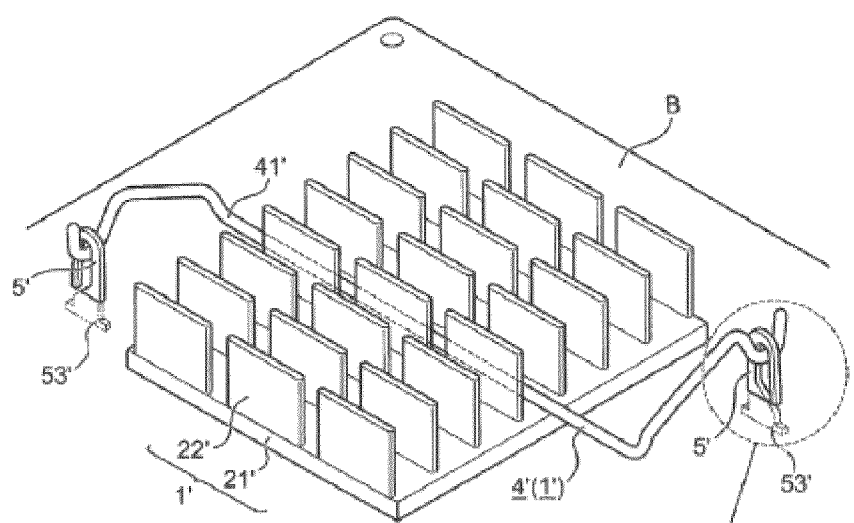
FIG. 17(a) is a perspective view showing a mounting structure in the past in which a wire spring is used and FIG. 17(b) is an explanatory diagram showing an anchor that can be applied in this mounting structure, the anchor being attached from the upper surface of a circuit board.
Figure 17:
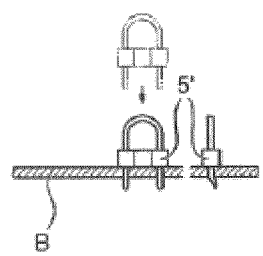

In the embodiments explained above, when the anchors 5 are set on the circuit board B, as the basic setting form, the anchors 5 are fit in (press fit) from the substrate rear surface (the non-mounting surface of the heat sink 1). However, as long as the anchors 5 can be firmly set (vertically provided) on the circuit board B, the anchors 5 may be fit in from the mounting surface side of the heat sink 1 and joined by an adhesive, soldering, or the like. In the embodiments explained above, for example, knurling is applied to the joining sections 54 as appropriate to reinforce a fixing force taking into account the press-fit of the anchors 5 from the substrate rear surface. However, such machining is not always limited to the knurling. Serration can also be applied. Alternatively, for example, as shown in FIGS. 16(a) and 16(b), rib-like protrusions may be radially formed around the joining sections 54 or spherical (semispherical) protrusions may be formed instead of the rib-like protrusions. As shown in FIG. 16(c), the entire joining sections 54 may be formed in a taper shape (a form in which the entire circumferences of the joining sections 54 are formed as returns) or, as shown in FIG. 16(*d*), such returns can also be partially formed in the joining sections 54.

REFERENCE SIGNS LIST 1 heat sink
1A heat sink (first embodiment)
1B heat sink (second embodiment)
1C heat sink (third embodiment)
1D heat sink (fourth embodiment)
1E heat sink (fifth embodiment)
2 heat sink body
4 spring member
5 anchors
5C anchors (third embodiment)
5D anchors (fourth embodiment)
6 attachment pieces
6C attachment pieces (third embodiment)
6D attachment pieces (fourth embodiment)
2 heat sink body
21 base
22 heat radiation fins
23 positioning sections
24 posts (fifth embodiment)
25 locking projections for assembly (fifth embodiment)
4 spring member
41 wire spring
42 center torsion section
43 arm sections
44 fold-back sections
5 anchors
51 base sections
52 main body sections
53 flanges
54 joining sections
55 attaching sections (steps/anchor heads)
56 small diameter sections
57 reception tip portions
6 attachment pieces
61 main body sections
62 opening sections
62*a* openings for hooking
62*b* openings for pierce-through
62*c* openings for communication
62*d* openings for locking (fifth embodiment)
63 held sections
64 mounted state locks
65 sub-assembled state locks (fifth embodiment)
66 holes (for tool insertion)
68 openings for slide (second embodiment)
71 insertion hole (third embodiment)
72 returns (third embodiment)
74 groove (fourth embodiment)
B circuit board
C semiconductor circuit element
H attachment hole
M mounting means
T tool

The invention claimed is:

1. A structure for mounting a heat sink in which a heat sink body including a base compression-bonded to a semiconductor circuit element on a circuit board and heat radiation fins projecting from the base is mounted on the circuit board using a spring member, the structure comprising:

first and second anchors for mounting the heat sink body on the circuit board with the anchors on the circuit board in a projected state to a mounting side of the heat sink body and the spring member to be indirectly attached at each of both ends of the spring member to respective ones of the first and second anchors to attach the heat sink body on the circuit board, wherein first and second attachment pieces each formed separately from the spring member are provided at respective ones of the both ends of the spring member, the first and second attachment pieces provided at respective ones of the both ends of the spring member are provided to be capable of pivoting or sliding with respect to the spring member, the first and second anchors each include a base section to be fixed to the circuit board and a main body section for projecting to the heat sink body side from the circuit board, and an attaching section to which the respective one of the first and second attachment pieces is to be attached is formed in the main body section, the main body section of each of the first and second anchors is formed in a substantially columnar shape or a regular prism shape, and a structure for indirectly attaching each of the both ends of the spring member to the respective ones of the first and second anchors in mounting the heat sink body on the circuit board is a structure for attaching the respective attachment pieces to the attaching section of the respective anchor in an externally fit state.

2. The structure for mounting the heat sink described in claim 1, wherein, in each of the first and second anchors, the base section and the main body section are integrally formed and the attaching section is formed integrally with the main body section, and the attaching section is configured by a step formed by a small diameter section formed thinner than the main body section and a main body section on a tip side.

3. The structure for mounting the heat sink described in claim 1, wherein the main body section of each of the first and second anchors is formed in a substantially columnar shape having a maximum diameter of about 1.7 mm.

4. The structure for mounting the heat sink described in claim 1, wherein each of the first and second anchors includes a flange extending to the outer circumferential side at an end of the base section, and, in setting the anchor on the circuit board, the anchor is fit in from the opposite side of a mounting surface of the heat sink.

5. The structure for mounting the heat sink described in claim 1, wherein each of the first and second anchors is adapted to be set on the circuit board on an inner side of a range in which the heat sink body is mounted.

6. The structure for mounting the heat sink described in claim 1, wherein each of the first and second anchors is useful as a positioning section in mounting the heat sink body on the circuit board.

7. The structure for mounting the heat sink described in claim 1, wherein each of the attachment pieces has a mounted state lock that prevents, in a state in which the heat sink body is mounted on the circuit board, movement of the attachment piece in a dismounting direction.

8. The structure for mounting the heat sink described in claim 1, wherein at a stage before mounting the heat sink body on the circuit board, the position and the posture of the attachment pieces can be changed with respect to the spring member to lock the attachment pieces to a part of the heat sink body to obtain a sub-assembled state in which the spring member is assembled to the heat sink body.

9. A heat sink in which a heat sink body including a base compression-bonded to a semiconductor circuit element on a circuit board and heat radiation fins projecting from the base is mounted on the circuit board using a spring member, wherein
   the heat sink body is mounted on the circuit board by the mounting structure described in claim 1.

\* \* \* \* \*